(12) United States Patent
Masuda et al.

(10) Patent No.: US 8,217,115 B2
(45) Date of Patent: Jul. 10, 2012

(54) LIQUID RESIN COMPOSITION, SEMICONDUCTOR WAFER HAVING ADHESIVE LAYER, SEMICONDUCTOR ELEMENT HAVING ADHESIVE LAYER, SEMICONDUCTOR PACKAGE, PROCESS FOR MANUFACTURING SEMICONDUCTOR ELEMENT AND PROCESS FOR MANUFACTURING SEMICONDUCTOR PACKAGE

(75) Inventors: Takeshi Masuda, Tokyo (JP); Hikaru Okubo, Tokyo (JP)

(73) Assignee: Sumitomo Bakelite Company, Ltd, Tokyo (JP)

( * ) Notice: Subject to any disclaimer, the term of this patent is extended or adjusted under 35 U.S.C. 154(b) by 455 days.

(21) Appl. No.: 12/446,901

(22) PCT Filed: Oct. 30, 2007

(86) PCT No.: PCT/JP2007/001181
§ 371 (c)(1),
(2), (4) Date: Apr. 23, 2009

(87) PCT Pub. No.: WO2008/053590
PCT Pub. Date: May 8, 2008

(65) Prior Publication Data
US 2010/0006998 A1 Jan. 14, 2010

(30) Foreign Application Priority Data

Oct. 30, 2006 (JP) .................................. 2006-294832
Oct. 31, 2006 (JP) .................................. 2006-296173

(51) Int. Cl.
*C08L 63/00* (2006.01)
*C08L 63/04* (2006.01)
(52) U.S. Cl. ........ 525/109; 525/108; 525/481; 525/523; 525/529
(58) Field of Classification Search ........................ None
See application file for complete search history.

(56) References Cited

U.S. PATENT DOCUMENTS

2003/0054643 A1*  3/2003  Aihara et al. ................. 438/689

FOREIGN PATENT DOCUMENTS

| JP | 6-132327 | | | 5/1994 |
| JP | 7-201897 | | | 8/1995 |
| JP | 2000-174044 | | | 6/2000 |
| JP | 2000-252303 | | | 9/2000 |
| JP | 2001-093940 | | | 4/2001 |
| JP | 2002-294177 | | | 10/2002 |
| JP | 2003-212964 | | | 7/2003 |
| JP | 2003-347321 | | | 12/2003 |
| JP | 2004-247657 | A | * | 9/2004 |
| JP | 2004-256695 | A | * | 9/2004 |
| JP | 2005-150421 | A | * | 6/2005 |
| JP | 2006-96873 | | | 4/2006 |
| JP | 2006-269887 | | | 10/2006 |
| JP | 2007-311728 | | | 11/2007 |

OTHER PUBLICATIONS

Machine translation of JP 2006-269887 (2006).*
International Search Report.

* cited by examiner

*Primary Examiner* — Robert Sellers
(74) *Attorney, Agent, or Firm* — Smith, Gambrell & Russell, LLP

(57) ABSTRACT

A liquid resin composition of the present invention is a liquid resin composition for bonding a semiconductor element on a support, exhibiting a tackiness of 0.05 N or less after heating at 120° C. for 10 min and a tackiness of 1 N or more at 80° C. A semiconductor wafer having an adhesive layer of the present invention is a semiconductor wafer having an adhesive layer in which the adhesive layer is formed from the above liquid resin composition. A process for manufacturing a semiconductor element of the present invention has the application step of applying an adhesive as a liquid resin composition containing a thermosetting resin and a solvent to one side of a wafer; the evaporation step of evaporating said solvent while substantially maintaining a molecular weight of said liquid resin composition to form an adhesive layer; the bonding step of bonding a dicing sheet on one side of said wafer; and the cutting step of cutting said wafer into pieces.

4 Claims, 2 Drawing Sheets

LIQUID RESIN COMPOSITION, SEMICONDUCTOR WAFER HAVING ADHESIVE LAYER, SEMICONDUCTOR ELEMENT HAVING ADHESIVE LAYER, SEMICONDUCTOR PACKAGE, PROCESS FOR MANUFACTURING SEMICONDUCTOR ELEMENT AND PROCESS FOR MANUFACTURING SEMICONDUCTOR PACKAGE

TECHNICAL FIELD

The present invention relates to a liquid resin composition, a semiconductor wafer having adhesive layer, a semiconductor element having adhesive layer, a semiconductor package, a process for manufacturing a semiconductor element and a process for manufacturing a semiconductor package.

BACKGROUND ART

Recently, devices such as cellular phones, personal digital assistances and DVC (digital video camera) have been significantly improved in their performance, getting smaller and lighter, and for semiconductor package improvement of performance, down sizing and lightening have been strongly required. There have been, therefore, attempts to mount a plurality of semiconductor elements having different functions or a plurality of semiconductor elements having the same function in one package for improving performance of a semiconductor package, or to make the size of a semiconductor package closer to the size of an element as much as possible for size- and weight-reduction. Thus, semiconductor elements have been much thinner and a distance of a wire-bond pad between a semiconductor element and a support such as a metal or organic substrate has been shorter and shorter.

In a die attach step in a conventional assembling process for a semiconductor, a liquid die attach material is applied on a support and a semiconductor element is mounted on it at room temperature and then cured by heating for adhesion of the semiconductor element to the support, but there have emerged potential problems such as contamination of a die attach material to the surface of a semiconductor element or a wire-bond pad and contamination due to bleeding of a die attach material (a phenomenon that only a liquid ingredient in a die attach material moves via capillary phenomenon).

Thus, alternative processes have been employed, including attaching a film die attach material instead of a liquid die attach material to a support, on which a semiconductor element is mounted under heating; attaching a semiconductor wafer with a film die attach material on the back surface to a dicing sheet, which is cut into pieces to give a semiconductor element with a die attach material, which is then mounted on a support under heating; and attaching a semiconductor wafer to a die attach film acting as a dicing sheet, which is then cut into pieces to give a semiconductor element with a die attach material, which is then mounted on a support under heating (for example, see Patent References 1 and 2).

Meanwhile, not only a semiconductor element but also a support have been thinner as a trend of multi-layered stacking of semiconductor element and thinning of semiconductor package. The use of a thin support leads to more prominent warpage of a package due to a difference in a coefficient of thermal expansion among composition of semiconductor package. Furthermore, an insulating film with a low dielectric constant is used as an interlayer insulating film for reducing transmission delay due to reduction in a signal propagation rate caused by a parasitic capacitance between interconnections in order to provide a higher-speed semiconductor device, but generally, an insulating film with a low dielectric constant is brittle and warpage of a semiconductor element may lead to crack or delamination of the insulating layer.

Since warpage of a semiconductor package or semiconductor element is caused by a difference in a coefficient of thermal expansion between constituting members, it is desired to mount a semiconductor element at a reduced temperature when using a film die attach material.

It is, therefore, necessary to use a thermoplastic component with a low glass transition temperature or to increase components with a low molecular weight as an ingredient of film die attach material for lowering a temperature during mounting a semiconductor element, but it leads to occurrence of tackiness (stickiness) even at a temperature near an ambient temperature.

Stickiness at a temperature near an ambient temperature may often cause deterioration in pick-up properties in the step of peeling a semiconductor element from a dicing sheet and adhesion of a semiconductor element picked up to a stage in the step of temporarily placing it on a different stage (for example, see Patent References 3 to 5).

There have been several attempts to use a material which is not tacky at an ambient temperature, as a encapsulant for a wafer level chip size package (for example, Patent References 6 to 8). In these inventions, a resin composition is applied to a wafer with a bump such as solder and made non-tacky by heating before being cut into pieces, but it must be subjected to bonding at a temperature of a melting point of a solder or higher because encapsulating and solder bonding are simultaneously conducted in a subsequent step.

As described above, there are no resin compositions meeting the requirement that they can be mounted at a low temperature while not being sticky at an ambient temperature.

Patent Reference 1: Japanese published unexamined application No. 2002-294177;
Patent Reference 2: Japanese published unexamined application No. 2003-347321;
Patent Reference 3: Japanese published unexamined application No. 1994-132327;
Patent Reference 4: Japanese published unexamined application No. 1995-201897;
Patent Reference 5: Japanese published unexamined application No. 2000-252303;
Patent Reference 6: Japanese published unexamined application No. 2000-174044;
Patent Reference 7: Japanese published unexamined application No. 2001-93940;
Patent Reference 8: Japanese published unexamined application No. 2003-212964.

DISCLOSURE OF THE INVENTION

To solve the above problems, an objective of the present invention is to provide a liquid resin composition which can be mounted on a support at a low temperature and is not sticky at an ambient temperature after heating; a semiconductor wafer having an adhesive layer formed using the liquid resin composition; a semiconductor element having an adhesive layer formed using the liquid resin composition; a semiconductor package manufactured using the liquid resin composition; a process for manufacturing a semiconductor element having an adhesive layer which can be mounted on a support at a low temperature and is not sticky at an ambient temperature; and a process for manufacturing a semiconductor package.

Such an objective can be achieved by the present invention described in [1] to [25].

[1] A liquid resin composition for bonding a semiconductor element on a support, exhibiting a tackiness of 0.05 N or less at 25° C. after heating said liquid resin composition at 120° C. for 10 min and a tackiness of 1 N or more at 80° C. after heating said liquid resin composition at 120° C. for 10 min.

[2] The liquid resin composition as described in [1], wherein said liquid resin composition contains volatiles in 1% by weight or less after said heating.

[3] The liquid resin composition as described in [1], wherein a ratio (b/a) is 0.6 or more, where (a) is an area of a molecular weight of 200 or more and (b) is an area of a molecular weight of 200 or more and 5000 or less as determined for said liquid resin composition by GPC before said heating.

[4] The liquid resin composition as described in [1], wherein [(b'/a')/(b/a)] is 0.7 or more where (b'/a') is a ratio of an area (b') of a molecular weight of 200 or more and 5000 or less to an area (a') of a molecular weight of 200 or more as determined for said liquid resin composition by GPC after said heating, and (b/a) is a ratio of an area (b) of a molecular weight of 200 or more and 5000 or less to an area (a) of a molecular weight of 200 or more as determined for said liquid resin composition by GPC before said heating.

[5] The liquid resin composition as described in [1], comprising compound (A) having a glycidyl group and compound (B) having a phenolic hydroxy group.

[6] The liquid resin composition as described in [5], wherein said compound (B) having a phenolic hydroxy group comprises compound (B1) having a molecular weight of 1000 or less and compound (B2) having a molecular weight of 1500 or more and 5000 or less.

[7] The liquid resin composition as described in [6], wherein said compound (B2) is a compound containing hydroxystyrene as a monomer component.

[8] The liquid resin composition as described in [6], wherein said compound (B2) has a dispersion degree of 1.5 or less.

[9] The liquid resin composition as described in [6], wherein a weight ratio as said compound (B1)/said compound (B2) is 0.6 or more and 7 or less.

[10] A semiconductor wafer having an adhesive layer formed from a liquid resin composition comprising a thermosetting resin and a solvent, wherein said adhesive layer has a tackiness of 0.05 N or less at 25° C. and 1 N or more at 80° C.

[11] The semiconductor wafer having an adhesive layer as described in [10], wherein said adhesive layer contains volatiles in 1% by weight or less.

[12] The semiconductor wafer having an adhesive layer as described in [10], wherein said adhesive layer is formed by heating a liquid resin composition wherein a ratio of an area (b) of a molecular weight of 200 or more and 5000 or less to an area (a) of a molecular weight of 200 or more as determined by GPC (b/a) is 0.6 or more.

[13] The semiconductor wafer having an adhesive layer as described in [10], wherein said adhesive layer is formed by heating a liquid resin composition and [(b'/a')/(b/a)] is 0.7 or more where (b'/a') is a ratio of an area (b') of a molecular weight of 200 or more and 5000 or less to an area (a') of a molecular weight of 200 or more as determined by GPC, and (b/a) is a ratio of an area (b) of a molecular weight of 200 or more and 5000 or less to an area (a) of a molecular weight of 200 or more as determined for said liquid resin composition by GPC before said heating.

[14] The semiconductor wafer having an adhesive layer as described in [10], wherein said adhesive layer has a surface roughness of +5 μm.

[15] The semiconductor wafer having an adhesive layer as described in [10], wherein a dicing sheet is bonded to the adhesive layer side in said semiconductor wafer having an adhesive layer.

[16] A semiconductor element having an adhesive layer, wherein the semiconductor wafer having an adhesive layer as described in [15] is cut into pieces by dicing.

[17] A semiconductor package wherein the semiconductor element having an adhesive layer as described in [16] is mounted on a support.

[18] A process for manufacturing a semiconductor element, comprising the application step of applying an adhesive as a liquid resin composition containing a thermosetting resin and a solvent to one side of a wafer; the evaporation step of evaporating said solvent while substantially maintaining a molecular weight of said liquid resin composition to form an adhesive layer; the laminating step of laminating a dicing sheet on one side of said wafer; and the cutting step of cutting said wafer into pieces, wherein the adhesion layer after said evaporation step has a tackiness of 0.05 N or less at 25° C. and 1 N or more at 80° C.

[19] The process for manufacturing a semiconductor element as described in [18], wherein a ratio of an area (b) of a molecular weight of 200 or more and 5000 or less to an area (a) of a molecular weight of 200 or more as determined for said liquid resin composition by GPC in said application step (b/a) is 0.6 or more.

[20] The process for manufacturing a semiconductor element as described in [18], wherein [(b'/a')/(b/a)] is 0.7 or more where (b'/a') is a ratio of an area (b') of a molecular weight of 200 or more and 5000 or less to an area (a') of a molecular weight of 200 or more as determined for said adhesive layer by GPC after said evaporation step, and (b/a) is a ratio of an area (b) of a molecular weight of 200 or more and 5000 or less to an area (a) of a molecular weight of 200 or more as determined for said liquid resin composition by GPC in said application step.

[21] The process for manufacturing a semiconductor element as described in [18], wherein said adhesive layer after said evaporation step contains volatiles in 1% by weight or less.

[22] The process for manufacturing a semiconductor element as described in [18], wherein in said application step, an adhesive made of a liquid resin composition is applied to one side of said wafer by spin coating.

[23] The process for manufacturing a semiconductor element as described in [18], wherein in said application step, said liquid resin composition is applied to one side of said wafer while moving in relation to said wafer a nozzle for discharging said liquid resin composition.

[24] A process for manufacturing a semiconductor package comprising the step of mounting a semiconductor element manufactured by the process as described in [18] on a support.

[25] The process for manufacturing a semiconductor package as described in [24], wherein the step of mounting said semiconductor element on a support is conducted at 200° C. or less.

The present invention can provide a liquid resin composition which can be mounted on a support at a low temperature and is not sticky at an ambient temperature; a semiconductor wafer having an adhesive layer formed using the liquid resin composition; a semiconductor element having an adhesive layer formed using the liquid resin composition; a semiconductor package manufactured using the liquid resin composition; a process for manufacturing a semiconductor element; and a process for manufacturing a semiconductor package.

BRIEF DESCRIPTION OF THE DRAWINGS

The objective described above and other objectives, features and advantages will be more clearly understood with reference to suitable embodiments described below and accompanying drawings.

BEST MODE FOR CARRYING OUT THE INVENTION

Figure 1:
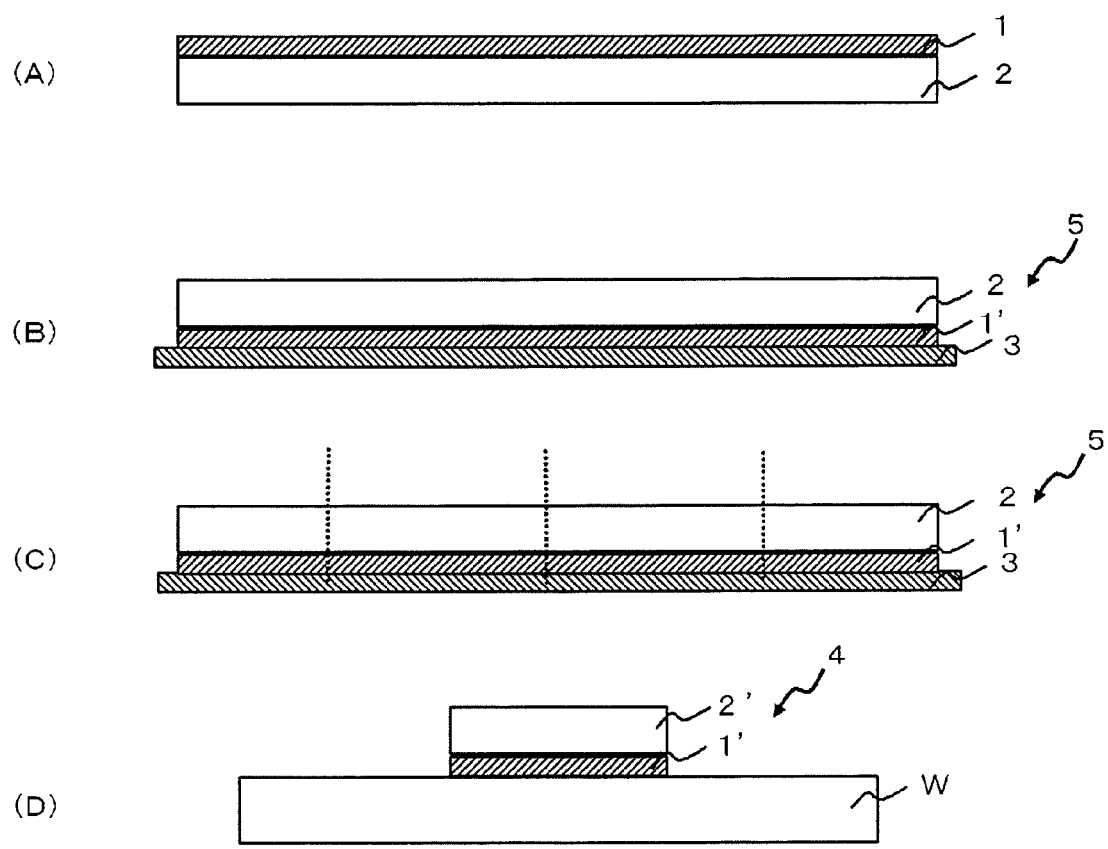
FIG. 1 is a schematic view illustrating a manufacturing process for a semiconductor package according to one embodiment of the present invention.

There will be described the present invention.
Liquid Resin Composition

A liquid resin composition according to the present invention is applied to, for example, the back surface of a semiconductor wafer as an adhesive. The semiconductor wafer together with the liquid resin composition is heated and diced to give a semiconductor element having an adhesive layer. This semiconductor element having an adhesive layer can be mounted on a support to give a semiconductor package.

A liquid resin composition is applied to one side of a wafer to a thickness of 50 μm and heated at 120° C. for 10 min, after which it has a tackiness of 0.05 N or less at 25° C. and 1 N or more at 80° C.

Particularly, a liquid resin composition is applied to one side of a wafer to a thickness of 50 μm and heated at 120° C. for 10 min, after which it preferably has a tackiness of 0.02 N or less at 25° C. and 1.5 N or more at 80° C.

After the composition is applied to one side of a wafer to a thickness to 50 μm and heated at 120° C. for 10 min, it preferably contains volatiles in 1% by weight or less.

A surface roughness (thickness precision) is preferably within ±5 μm, and such a liquid resin composition preferably contains a thermosetting resin which is solidified at an ambient temperature and a solvent (diluent) for dissolving the thermosetting resin. Examples of such a thermosetting resin may include epoxy resins which are solidified at an ambient temperature, acrylic resins which are solidified at an ambient temperature, maleimide resins which are solidified at an ambient temperature and phenol resins which are solidified at an ambient temperature.

Particularly preferred are, but not limited to, a composition containing compound (A) having a glycidyl group and compound (B) having a phenolic hydroxy group, where compound (B) having a phenolic hydroxy group preferably contains compound (B1) having a molecular weight of 1000 or less and compound (B2) having a molecular weight of 1500 or more and 5000 or less. A molecular weight as used herein is a number average molecular weight (Mn) as determined by GPC (gel permeation chromatography).

Compound (A) having a glycidyl group is preferably an epoxy resin which has two or more glycidyl groups in one molecule and is a solid at an ambient temperature, more preferably having a softening point of 40° C. or more and 80° C. or less. If a softening point is lower than the range, a tackiness at 25° C. after applying it to one side of a wafer and heating it may be more than 0.05 N and if being higher than the range, a tackiness at 80° C. may be less than 1 N.

Examples of such an epoxy resin include phenol novolac type epoxy resins, cresol novolac type epoxy resins, phenol aralkyl type epoxy resins, biphenyl aralkyl type epoxy resins, dicyclopentadiene type epoxy resins, and epoxy resins having a triphenylmethane skeleton, epoxy resins having a naphthalene skeleton and epoxy resins having an anthracene skeleton, but a crystallizable resin must be carefully used because it may deposit in a liquid resin composition or after application to one side of a wafer and heating.

A softening point can be determined by, for example, a ring-and-ball method in accordance with JISK7234.

Compound (B) having a phenolic hydroxy group is preferably, for example, a phenol resin which is a solid at 25° C. and particularly preferably compound (B) having a phenolic hydroxy group contains compound (B1) having a molecular weight of 1000 or less and compound (B2) having a molecular weight of 1500 or more and 5000 or less.

When using compound (B1) having a molecular weight of 1000 or less alone, it results in good tackiness at 25° C. and 80° C. and good adhesive strength at 25° C. while leading to excessively lower adhesive strength at 130° C. and 175° C. after heating the composition applied to one side of a wafer at 120° C. for 10 min. Thus, when a semiconductor element having an adhesive layer is mounted on a support and then wire bonding is conducted without post curing, a semiconductor element moves during wire bonding, leading to problems such as defective wire bonding and detachment of the semiconductor element during encapsulating the resin. Thus, by using compound (B2) having a molecular weight of 1500 or more and 5000 or less together, adhesive strength can be improved at 130° C. and 175° C. after mounting the semiconductor element having an adhesive layer on a support.

On the other hand, when using compound (B2) alone as compound (B), a liquid resin composition becomes too high viscosity and a tackiness at 80° C. after heating the composition applied to one side of a wafer may be too reduced to allow for mounting at a low temperature. A weight ratio of compound (B1) to compound (B2), that is, (B1)/(B2), is preferably 0.1 or more and 9 or less, more preferably 0.6 or more and 7 or less, further preferably 0.8 or more and 3 or less.

There are no particular restrictions to compound (B1) as long as it has two or more phenolic hydroxy groups and has a molecular weight of 1000 or less. Specific examples include bisphenols such as bisphenol-A, bisphenol-F and bisphenol-S; compounds obtained by a reaction of phenol or its derivative with formaldehyde such as phenol novolac and cresol novolac; compounds obtained by a reaction of phenol or its derivative with benzaldehyde; phenol aralkyl type phenol resins; biphenyl aralkyl type phenol resins; and compounds having two or more phenolic hydroxy groups (containing a hydroxy group directly bonded to an aromatic ring such as a naphthol type hydroxy group) in one molecule and having a naphthalene or anthracene skeleton. Even when compound (B1) has a high softening point, an epoxy resin may be added to reduce a softening point of a mixture, and therefore, a compound having a softening point of about 150° C. may be satisfactorily used.

There are no particular restrictions to compound (B2) as long as it has two or more phenolic hydroxy groups and has a molecular weight of 1500 or more and 5000 or less, and particularly preferred is a compound containing hydroxystyrene as a monomer component, specifically a polyhydroxystyrene or hydroxystyrene copolymer obtained by radical polymerization or ion polymerization of hydroxystyrene alone or of hydroxystyrene with a compound copolymerizable with it, having a molecular weight of 1500 or more and 5000 or less. More preferred is a polyhydroxystyrene or hydroxystyrene copolymer having a molecular weight of 1500 or more and 3000 or less.

As such compound (B2), particularly preferred is a compound having a dispersion degree (a ratio of a weight average molecular weight (Mw) to a number average molecular weight (Mn) as determined by GPC) of 1.5 or less because it facilitates achieving both good mounting properties at a low temperature and good adhesive strength at 130° C. and 175° C. after mounting. A more preferable dispersion degree is 1.3 or less.

When using compound (B2) having a dispersion degree of more than 1.5, a liquid resin composition may become too high viscosity and mounting properties at a low temperature may be deteriorated.

A rate of compound (A) to compound (B) is preferably such that glycidyl group phenolic hydroxy group is 1:0.7 to 1.3. More preferably, glycidyl group:phenolic hydroxy group is 1:0.9 to 1.1. A hardening accelerator may be added in order to accelerate a reaction of a glycidyl group with a phenolic hydroxy group. Examples of a hardening accelerator which can be used include imidazoles and phosphorous-containing compounds. Although generally a resin composition containing a photoinitiator which initiates a reaction by energy beam such as ultraviolet ray is well-known, involvement of a photoinitiator is undesirable because a sequence of application of a liquid resin composition, heating, dicing and semiconductor-element mounting are conducted generally under lighting by a fluorescent lamp. When a photoinitiator is contained, for example, viscosity of a resin composition may change over time during the step of applying a liquid resin composition by spin coating, making it difficult to give an adhesive layer having a stable thickness.

Preferably, a diluent used is capable of dissolving a thermosetting resin and has a boiling point of 100° C. or high and 240° C. or low because a liquid resin composition is applied to one side of a wafer by screen printing, stencil printing or spin coating. If a thermosetting resin is insoluble, a surface after application may become uneven, leading to problems during cutting described later (for example, lift off of chips) and also residual air in mounting on a support. If a diluent used has a boiling point of 100° C. or less, viscosity significantly varies due to evaporation during an application process, which may cause unevenness in a thickness and blurred region, and if a boiling point is higher than 240° C., too much volatiles remain after heating, which may lead to residual stickiness.

There are no particular restrictions to such a diluent as long as it can sufficiently dissolve a thermosetting resin used, but a halogen-containing diluent is undesirable because it is used for a semiconductor. Furthermore, a diluent which may deteriorate storage stability of a liquid resin composition is undesirable, including amine diluents such as primary and secondary amines. Examples of diluents which can be used include the followings which may be used alone or in combination of two or more. Specific examples include octane, 2,2,3-trimethylpentane, nonane, 2,2,5-trimethylhexane, decane, dodecane, 1-octene, 1-nonene, 1-decene, toluene, o-xylene, m-xylene, p-xylene, ethylbenzene, cumene, mesitylene, tetraline, n-butylbenzene, sec-butylbenzene, tert-butylbenzene, p-cymene, o-diethylbenzene, m-diethylbenzene, p-diethylbenzene, pentylbenzene, methylcyclohexane, ethylcyclohexane, p-menthane, bicyclohexyl, α-pinene, dipentene, decaline, 1-butanol, isobutyl alcohol, 1-pentanol, 2-pentanol, 3-pentanol, 2-methyl-1-butanol, isopentyl alcohol, tert-pentyl alcohol, 3-methyl-2-butanol, neopentyl alcohol, 1-hexanol, 2-methyl-1-pentanol, 4-methyl-2-pentanol, 2-ethyl-1-butanol, 1-heptanol, 2-heptanol, 3-heptanol, 1-octanol, 2-octanol, 2-ethyl-1-hexanol, 1-nonanol, 3,5,5-trimethyl-1-hexanol, 1-decanol, benzyl alcohol, cyclohexanol, 1-methylcyclohexanol, 2-methylcyclohexanol, 3-methylcyclohexanol, α-terpineol, 1,2-ethanediol, 1,2-propanediol, 1,3-propanediol, 1,2-butanediol, 1,3-butanediol, 1,4-butanediol, 2,3-butanediol, 2-butene-1,4-diol, 2-methyl-2,4-pentanediol, dibutyl ether, dihexyl ether, anisol, phenetol, butyl phenyl ether, pentyl phenyl ether, o-methoxytoluene, m-methoxytoluene, p-methoxytoluene, benzyl ethyl ether, dioxane, 1,2-diethoxyethane, 1,2-dibutoxyethane, diethyleneglycol dimethyl ether, diethyleneglycol diethyl ether, 1-methylglycerin ether, 2-methylglycerin ether, 1,2-dimethylglycerin ether, 1,3-dimethylglycerin ether, trimethylglycerin ether, 1-ethylglycerin ether, 1,3-diethylglycerin ether, triethylglycerin ether, acetal, 2-pentanone, 3-pentanone, 2-hexanone, methyl isobutyl ketone, 2-heptanone, 4-heptanone, diisobutyl ketone, acetonylacetone, mesytyl oxide, isophorone, cyclohexanone, methylcyclohexanone, butyl formate, pentyl formate, propyl acetate, butyl acetate, isobutyl acetate, sec-butyl acetate, pentyl acetate, isopentyl acetate, 3-methoxybutyl acetate, sec-hexyl acetate, 2-ethylbutyl acetate, 2-ethylhexyl acetate, cyclohexyl acetate, benzyl acetate, butyl propionate, isopentyl propionate, butyratemethyl, ethyl butyrate, butyl butyrate, isopentyl butyrate, isobutyl isobutyrate, ethyl isovalerate, methyl benzoate, ethyl benzoate, propyl benzoate, γ-butyrolactone, diethyl oxalate, dipentyl oxalate, diethyl malonate, dimethyl maleate, diethyl maleate, tributyl citrate, ethyleneglycol monoacetate, ethyleneglycol diacetate, ethyleneglycol monoformate, ethyleneglycol monobutyrate, diethyleneglycol monoacetate, monoacetin, diethyl carbonate, N,N-dimethylformamide, N,N-diethylformamide, N,N-dimethylacetamide, N,N,N',N'-tetramethylurea, N-methylpyrrolidone, 2-methoxyethanol, 2-ethoxyethanol, 2-(methoxyethoxy)ethanol, 2-isopropoxyethanol, 2-butoxyethanol, 2-(isopentyloxy)ethanol, 2-(hexyloxy)ethanol, furfuryl alcohol, tetrahydrofurfuryl alcohol, diethyleneglycol, diethyleneglycol monomethyl ether, diethyleneglycol monoethyl ether, diethyleneglycol monobutyl ether, 1-methoxy-2-propanol, 1-ethoxy-2-propanol, dipropyleneglycol, dipropyleneglycol monomethyl ether, dipropyleneglycol monoethyl ether, diacetone alcohol, N-ethylmorpholine, methyl lactate, ethyl lactate, butyl lactate, 2-methoxyethyl acetate, 2-ethoxyethyl acetate, 2-butoxyethyl acetate, diethyleneglycol monoethyl ether acetate, methyl acetoacetate and ethyl acetoacetate. Among others, particularly preferred are those having a boiling point of 150° C. or more and 220° C. or less; particularly preferably, diethyleneglycol dimethyl ether, diethyleneglycol diethyl ether, 2-heptanone, diisobutyl ketone, cyclohexanone, methylcyclohexanone, 3-methoxybutyl acetate, 2-ethylbutyl acetate, γ-butyrolactone, ethyleneglycol monoacetate, ethyleneglycol diacetate, 2-butoxyethanol, diethyleneglycol monomethyl ether, diethyleneglycol monoethyl ether, dipropyleneglycol monomethyl ether, diacetone alcohol, 2-ethoxyethyl acetate, 2-butoxyethyl acetate and diethyleneglycol monoethyl ether acetate.

A liquid resin composition of the present invention may contain a thermoplastic resin. The use of thermoplastic resin may reduce a crosslink density and an elastic modulus of a cured product. Examples of a preferable thermoplastic resin include phenoxy resins and polymers of (meth)acrylate, and particularly compounds prepared by copolymerizing ethyl (meth)acrylate or butyl(meth)acrylate as a main component with glycidyl(meth)acrylate and acrylonitrile are suitably used. However, when such a thermoplastic resin having a high molecular weight is excessively used, a tackiness at 80° C. after application to one side of a wafer and heating may become less than 1 N. On the other hand, a thermoplastic resin having a low glass transition temperature may be used for maintaining a tackiness at 80° C. to a good level after application to one side of a wafer and heating, but it may lead to a tackiness of more than 0.05 N at 25° C. after application to one side of a wafer and heating or excessively reduced adhesive force of a semiconductor element having an adhesive layer mounted on a support at 130° C. and 175° C. Thus, if used, a thermoplastic resin is preferably added to 40% by weight or less to the total of compound (A), compound (B) and the thermoplastic resin. The amount is more preferably 30% by weight or less. It is particularly preferably 25% by weight or less.

Furthermore, a liquid resin composition of the present invention may contain, if necessary, a coupling agent, a leveling agent, an antifoam and a surfactant.

A liquid resin composition of the present invention can be prepared, for example, by mixing and heating a solvent, compound (A), compound (B) and, if necessary, a thermoplastic resin in a blender equipped with a heating unit and a stirrer to give a homogeneous solution, cooling the solution to 25° C., adding additives such as a hardening accelerator and a coupling agent and further mixing the mixture.

A liquid resin composition preferably meet the condition that a ratio (b/a) of an area (b) of a molecular weight of 200 or more and 5000 or less to an area (a) of a molecular weight of 200 or more in GPC measurement is 0.6 or more. The ratio (b/a) is particularly preferably 0.7 or more, more preferably 0.8 or more.

If (b/a) is less than 0.6, a tackiness at 80° C. after heating is insufficient, so that mounting properties of a semiconductor element having an adhesive layer may be deteriorated. Here, GPC measurement was conducted using Waters Alliance (2695 Separations Module, 2414 Reflective Index Detector, TSK Gel GMHHR-Lx2+TSK Guard Column HHR-Lx1, mobile phase: THF, 1.0 mL/min) under the conditions of a column temperature: 40.0° C., an inside temperature of a differential refractive index detector: 40.0° C., a sample injection volume: 100 μL and a sample concentration: 1 to 5 mg/mL. A molecular-weight calibration curve was obtained using Shodex Standard SL-105 (Showa Denko K. K.).

Furthermore, for a liquid resin composition, when (b'/a') is defined as a ratio of an area (b') of a molecular weight of 200 or more and 5000 or less to an area (a') of a molecular weight of 200 or more for an adhesive layer after applying the composition to one side of a wafer to a thickness of 50 μm and heating it at 120° C. for 10 min as determined by GPC, its ratio to the above b/a, [(b'/a')/(b/a)] is preferably 0.7 or more. The ratio [(b'/a')/(b/a)] is particularly preferably 0.8 or more.

If [(b'/a')/(b/a)] is less than 0.7, a tackiness at 80° C. after heating is insufficient, so that mounting properties of a semiconductor element having an adhesive layer may be deteriorated.

When a liquid resin composition is applied to one side of a wafer by spin coating, micron-size solids in liquid resin composition, if present, are undesirable because they cause reduced flatness of the surface of an adhesive layer after heating and formation of pinhole voids. Thus, deposition of a thermosetting resin or a hardening accelerator used in a liquid resin composition must be carefully observed. In preparation of a liquid resin composition, it is preferably filtrated through a 10 μm filter, more preferably filtrated through a 10 μm filter and then through a 3 μm filter, particularly preferably further filtrated through a 1 μm filter. In spin coating, a filler cannot be used. A viscosity of a liquid resin composition is preferably 1 Pa·s or more and 40 Pa·s or less. With a viscosity higher or lower than the range, an adhesive layer having an appropriate thickness cannot be obtained after spin coating. A viscosity value was determined using a Type E viscometer (Toki Sangyo Co., Ltd., 3 degree corn) at 25° C. and 2.5 rpm. A viscosity range is more preferably 2 Pa·s or more and 30 Pa·s or less, further preferably 2 Pa·s or more and 15 Pa·s or less.

Next, there will be described processes for manufacturing a semiconductor wafer having an adhesive layer, semiconductor element having an adhesive layer and a semiconductor package using the above liquid resin composition. They will be described with reference to FIGS. 1 and 2.

Application Step

In a practical use, the above liquid resin composition is applied to the back surface (the back side of a circuit surface) of a semiconductor wafer 2 having a bonding pad for wire bonding and the like to use as shown in FIG. 1(A). In FIG. 1, the symbol 1 is a liquid resin composition.

Here, a semiconductor wafer 2 may not have a circuit on its surface. Generally, a semiconductor wafer is subjected to backgrinding before dicing for controlling a thickness and the liquid resin composition 1 is applied after the backgrinding. The liquid resin composition 1 may be applied by, for example, screen printing, stencil printing or spin coating, preferably by spin coating in the light of stability in an application thickness and surface flatness. Spin coating can be conducted as known in the art. Briefly, a wafer on which a backgrinding tape (a tape attached to a circuit surface in order to protect the circuit surface of a wafer during backgrinding) is attached is set in a spin coater with the back side of the wafer up and while supplying the liquid resin composition to the center of the wafer at 15° C. or more and 40° C. or less, the wafer is rotated to evenly apply the liquid resin composition over the whole back surface of the wafer.

The backgrinding tape used preferably is adequately heat-resistant to tolerate the heating step described later and also preferably has a wafer-supporting function (prevention of warpage or deformation in a thinned wafer after backgrinding). A spin coating temperature lower than 15° C. is undesirable because a liquid resin composition is too high viscosity to give an even thickness after application, and a temperature higher than 40° C. is also undesirable because variation in a viscosity of the liquid resin composition due to evaporation may cause unevenness in an application thickness. A more preferable temperature range is 20° C. or more and 30° C. or less, and for achieving a more stable application thickness, application is preferably conducted in an environment controlled within ±2° C. A rotation speed of the wafer is generally 300 rpm or more and 10000 rpm or less, depending on a viscosity of a liquid resin composition used, an application temperature and a target application thickness. The liquid resin composition can be supplied by applying it on the stopped wafer which is then gradually rotated or by applying it on the wafer at a low rotation speed of, for example, 300 rpm and, if necessary, increasing a rotation speed.

Figure 2:
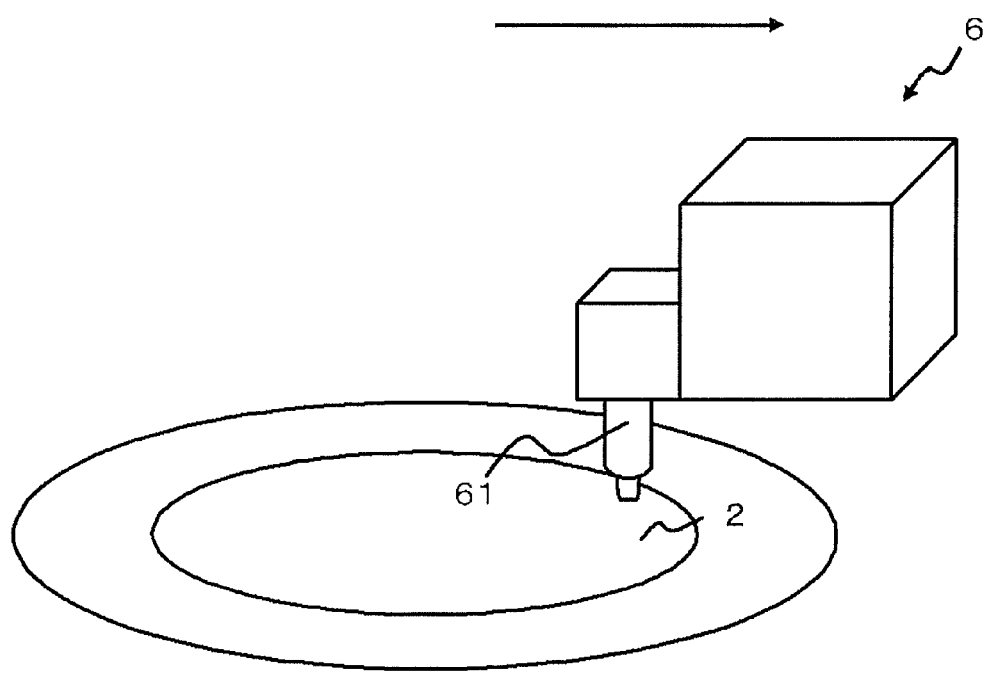
FIG. 2 is a schematic view illustrating a method for applying a liquid resin composition according to one embodiment of the present invention.

A liquid resin composition may be applied using a device 6 as shown in FIG. 2.

Here, while rotating a wafer 2, a nozzle 61 discharging the liquid resin composition is moved from the center of the wafer 2 toward the periphery (the direction indicated by an arrow in FIG. 2), to apply the liquid resin composition to one side of the wafer 2. The nozzle 61 moves in relation to the wafer 2.

Such a method can be employed to reduce a coating loss of the liquid resin composition.

There are no particular restrictions to a moving speed of the nozzle 61 or a rotation speed of the wafer 2, but, for example, the nozzle 61 may be moved in a manner that a moving speed gradually decrease from the center to the periphery of the wafer 2.

In a method employing the apparatus 6 shown in FIG. 2, the liquid resin composition may contain a filler.

Evaporation Step

Subsequently, the semiconductor wafer 2 on which the liquid resin composition 1 has been applied is heated. In this evaporation step, the wafer is heated to such a degree that a molecular weight of the liquid resin composition 1 does not vary, that is, the liquid resin composition 1 is little cured. Here, the liquid resin composition 1 after the evaporation process is an adhesive layer 1' (see FIG. 1(B)).

Specifically, when (b'/a') is a ratio of an area (b') of a molecular weight of 200 or more and 5000 or less to an area (a') of a molecular weight of 200 or more for an adhesive layer after the evaporation step as determined by GPC and (b/a) is a ratio of an area (b) of a molecular weight of 200 or more and, 5000 or less to an area (a) of a molecular weight of 200 or more for an adhesive layer (a liquid resin composition) in the application step as determined by GPC, a ratio of [(b'/a')/(b/a)] is preferably 0.7 or more, further preferably 0.8 or more.

As described above, increase of a viscosity in the adhesive layer 1' at a mounting temperature during mounting a semiconductor element on a support can be prevented by conducting heating in such a manner that a molecular weight of the liquid resin composition 1 does not vary. It can improve mounting properties at a low temperature in the later step of mounting a semiconductor element on a support.

Heating can be conducted on a hot plate, in an oven, a reflow furnace or the like and a heating temperature is preferably 200° C. or less, more preferably 150° C. or less. It is because a lower processing temperature can reduce a warpage after processing. A processing time is preferably 30 min or less. A processing time longer than that leads to a reduced yield and is disadvantageous in a warpage after processing. The particularly preferable heating conditions are 150° C. or less and 15 min or less, for example, 120° C. and 10 min. A thickness of the adhesive layer 1' after heating is preferably 200 μm or less, more preferably 5 μm or more and 50 μm or less. A thickness can be controlled by adjusting the application conditions and a viscosity of the liquid resin composition 1. For example, a low-viscosity liquid resin composition 1 can be used to give a thinner adhesive layer 1', and when employing spin coating as an application method, a rotation speed during application can be increased to give a thinner adhesive layer 1'. Although a film with a desired thickness must be prepared when using a film die attach material, the thickness can be controlled by adjusting the application conditions and a viscosity of the liquid resin composition 1.

When the adhesive layer 1' contains a large amount of volatiles after heating, it may cause stickiness of the adhesive layer 1', deterioration in pickup properties and void formation during mounting a support as described later, and therefore, a content of volatiles is preferably 1% by weight or less after applying the liquid resin composition 1 to the back surface of a wafer to a thickness of 50 μm and then heating it at 120° C. for 10 min. Here, a thickness of the liquid resin composition after application is measured by a noncontact thickness indicator. A content of volatiles is measured as described below.

The wafer on which a liquid resin composition has been applied to 50±5 μm is heated in an oven controlled at 120±5° C. for 10±1 min, and then 5 to 30 mg of the adhesive layer is sampled by a spatula before the wafer put out from the oven is cooled down.

The adhesive layer sample is analyzed by thermogravimetric analysis (TGA) elevating its temperature from 25° C. to 300° C. at a rate of 10° C./min to give a weight loss curve. A weight-loss rate at 200° C. in this weight loss curve ((a weight of an adhesive layer sample as measured by TGA–a weight at 200° C.)/a weight of an adhesive layer sample as measured by TGA) is defined as a content of volatiles. A weight-loss rate is more preferably 0.5% by weight or less, particularly preferably 0.1% by weight or less.

Preferably, the adhesive layer 1' does not have tackiness (stickiness) at 25° C. If it is sticky, defective travelling may be caused in the wafer mounting step where the wafer is laminated with a dicing sheet and problems may be caused in a pickup step described below. Thus, as already described in the section of "Liquid resin composition", an adhesive layer, after a liquid resin composition is applied to the back surface of a wafer to a thickness of 50 μm and then heated at 120° C. for 10 min, has a tackiness of 0.05 N or less at 25° C. as an indicator of stickiness.

As already described in the section of "Liquid resin composition", a tackiness at 80° C., after a liquid resin composition is applied to the back surface of a wafer to a thickness of 50 μm and then heated at 120° C. for 10 min, is 1 N or more in the light of mounting properties of a semiconductor element at a low temperature.

A tackiness is measured using a tackiness tester (RHESCA Company Ltd.) under the conditions of probe descending speed (Immersion Speed): 30 mm/min, test speed: 600 mm/min, adhesion load (Preload): 0.2 N, adhesion holding time (Press Time): 1.0 sec. and probe: 5.1 mmΦ (SUS304).

A tackiness described above is measured as described below.

A wafer on which a liquid resin composition has been applied to 50±5 μm is heated in an oven at 120±5° C. for 10±1 min, and then cooled. Then, the wafer is laminated with a dicing sheet (Sumitomo Bakelite Co., Ltd., FSL-N4003) in such a manner that the adhesive layer is down, and diced by a dicing saw into 6×6 mm pieces. A part of the semiconductor element having an adhesive layer as a 6×6 mm piece by dicing is manually peeled from the dicing sheet and measured for a tackiness of the adhesive layer side at 25° C. and 80° C. under the above conditions of tackiness measurement.

In the present invention, heating at 120° C. for 10 min means heating at 120±5° C. for 10±1 min.

The adhesive layer 1' in the wafer 5 having an adhesive layer prepared by this step has a tackiness of 0.05 N or less at 25° C. and 1 N or more a 80° C. A tackiness is measured under the conditions as described above. That is, a tackiness is measured using a tackiness tester (RHESCA Company Ltd.) under the conditions of probe descending speed (Immersion Speed): 30 mm/min, test speed: 600 mm/min, adhesion load (Preload): 0.2 N, adhesion holding time (Press Time): 1.0 sec. and probe: 5.1 mmΦ (SUS304). The wafer having an adhesive layer is laminated with a dicing sheet (Sumitomo Bakelite Co., Ltd., FSL-N4003) in such a manner that the adhesive layer is down, and diced by a dicing saw into 6×6 mm pieces. A part of the semiconductor element having an adhesive layer as a 6×6 mm piece by dicing is manually peeled from the dicing sheet and measured for a tackiness of the adhesive layer side at 25° C. and 80° C. under the above conditions of tackiness measurement.

The adhesive layer 1' contains volatiles in 1% by weight or less. A content of the volatiles is also measured by the method as described above; specifically, after evaporation, 5 to 30 mg of the adhesive layer is sampled by a spatula before the wafer is cooled down. The adhesive layer sample is analyzed by thermogravimetric analysis (TGA) elevating its temperature from 25° C. to 300° C. at a rate of 10° C./min to give a weight loss curve. A weight-loss rate at 200° C. in this weight loss curve ((a weight of an adhesive layer sample as measured by TGA−a weight at 200° C.)/a weight of an adhesive layer sample as measured by TGA) is defined as a content of volatiles.

Furthermore, a thickness precision (surface roughness) in the adhesive layer 1' in the wafer 5 having an adhesive layer is preferably within ±5 µm, more preferably ±3 µm. As used herein, the term "thickness precision" refers to a difference of a variation in irregularity within a chip plane determined by a laser roughness meter from an average surface profile. If a thickness precision is larger than that, a stable thickness cannot be obtained.

Laminating and Cutting Steps

Next, as shown in FIG. 1(B), the wafer 5 having an adhesive layer is laminated with the dicing sheet 3 and then is cut into pieces (diced) as shown in FIG. 1(C). A dotted line in FIG. 1(C) is a dicing line. Here, the wafer 5 having an adhesive layer is completely diced and the dicing sheet 3 is diced to the middle of its thickness. A dicing sheet 3 may be selected from those commercially available. Cutting is generally conducted using a specific apparatus such as a dicing saw to give a semiconductor element having an adhesive layer 4. As described above, when the adhesive layer is insufficiently flat, air may remain between the adhesive layer and the dicing sheet, leading to chip breaking (breaking of an edge of a chip) during dicing, chip crack (formation of a crack in an edge of a chip) and chip lift off (detachment of a chip from a dicing sheet during dicing), and thus to reduction in an yield of the semiconductor element having an adhesive layer 4.

The dicing sheet 3 is bonded to the side having the adhesive layer 1' in the wafer 5 having an adhesive layer.

By the above step, the semiconductor element having an adhesive layer 4 is prepared (see FIG. 1(D)).

In FIG. 1(D), the symbol 2' indicates a semiconductor element prepared by dicing the semiconductor wafer 2.

Process for Manufacturing a Semiconductor Package

The semiconductor element having an adhesive layer 4 thus prepared is set in a die bonder while being laminated with the dicing sheet 3 (the dicing sheet 3 laminated with a wafer ring). Then, it is picked up (the step of picking up a semiconductor element from the dicing sheet 3), and mounted on a support W under heating as shown in FIG. 1(D). In picking up, the semiconductor element having an adhesive layer 4 must be peeled from the dicing sheet 3 in their interface and if a tackiness of the adhesive layer 1' is more than 0.05 N at 25° C., there may occur problems; for example, the semiconductor element cannot be picked up, a semiconductor element having an adhesive layer 4 is so dislocated during picking up that it cannot be mounted in place, and a part of the adhesive layer 1' remains on the dicing sheet 3.

The support W on which a semiconductor element having an adhesive layer 4 according to the present invention is mounted may be, for example, a lead frame or an organic substrate. In FIG. 1(D), the support W is an organic substrate. When the semiconductor element having an adhesive layer 4 is laminated on another semiconductor element, the other semiconductor element becomes a support. The other semiconductor element is preferably mounted on a lead frame, an organic substrate or the like.

Mounting of a semiconductor element is conducted preferably at 200° C. or lower, more preferably at 150° C. or lower. Mounting of a semiconductor element at a high temperature may often cause warpage. A load is applied during mounting a semiconductor element and the load depends on the type of a die bonder. Although a load of 20 N per a semiconductor element can be applied in some types of bonders such as an LOC bonder, a load is generally about 3 to 5 N.

In the light of thinning of the semiconductor element 4 and the semiconductor element with lower mechanical strength, it is preferable that the element can be loaded with 5 N or less, more preferably 1 to 4 N. A mounting time (a time period of pressing a semiconductor element on a support) is preferably 10 sec or less, more preferably 3 sec or less, particularly preferably 1 sec or less in the light of productivity.

Thus, for mounting the semiconductor element having an adhesive layer 4 at a low temperature, the liquid resin composition 1 is applied to the back surface of a wafer to a thickness of 50 µm and a tackiness of the adhesive layer 1' after heating it at 120° C. for 10 min is preferably 1 N or more at 80° C. This is based on the result of mounting experiment in which various semiconductor elements with adhesive layer having different tackiness at 80° C. after heating are mounted on PBGA substrate, in many cases, a tackiness of 1 N or more at 80° C. can ensure 90% or more of an adhesion area after mounting while a tackiness of less than 1 N leads to less than 90% of an adhesion area. Here, an adhesion area after mounting was determined as an area of adhesion to an area of the semiconductor element when manually peeling a semiconductor element after mounting on a PBGA substrate. In an adhering part, the surface of a PBGA substrate looks somewhat whitish and rough while in a non-adhering part, a surface is flat and unchanged from the state before mounting, and they can be easily distinguished by visual checking. A tackiness at 80° C. was measured by the above tackiness measuring method for the adhesive layer side of a part of a semiconductor element having an adhesive layer cut into a piece of 6×6 mm, manually peeled from a dicing sheet, where the semiconductor element was prepared by heating a wafer on which a liquid resin composition was applied to 50±5 µm in an oven at 120±5° C. for 10±1 min, cooling it, attaching it to a dicing sheet (Sumitomo Bakelite Co., Ltd., FSL-N4003) in such a manner that the adhesive layer 1 is down, and dicing it by a dicing saw into 6×6 mm pieces.

It is preferable that an adhesion force is 1 N or more at 25° C. for a sample prepared by picking up the above semiconductor element having an adhesive layer cut into a 6×6 mm piece on a die bonder, and mounting it on a PBGA substrate (package size: 35×35 mm, core material: BT (bismaleimide-triazine) resin, solder resist: PSR4000AUS308 (Taiyo Ink Mfg. Co., Ltd.), thickness: 0.56 mm) under the conditions of bond load: 1.0 N, support heating temperature: 130° C., mounting time: 8 sec (including a time of 7 sec taken for the support surface to be heated to 130° C.). An adhesion force was measured using a die shear tester (Dage Holdings Ltd., Series 4000). If an adhesion force is less than that, a semiconductor element may be detached during conveying. It is more preferably 10 N or more, more preferably 20 N or more. It is particularly preferably 50 N or more.

The support W on which the semiconductor element having an adhesive layer 4 is mounted is, if necessary, cured by heating and then wire-bonded. Wire bonding can be conducted under the common conditions with no particular restrictions, but it is conducted preferably at a low temperature in the light of the above problem of warpage. A particularly preferable wire-bonding temperature is 150° C. or less. If an adhesion strength of the adhesive layer is too low during wire bonding, a semiconductor element 4 may be detached or wire bonding may be insufficiently strong. Thus, it is preferable that an adhesion force at 175° C. which is a little higher than a wire-bonding temperature is 100 N or more. Here, an adhesion strength at 175° C. is measured by a die shear tester (Dage Holdings Ltd., Series 4000) at 175° C. for a sample prepared by picking up, on a die bonder, a semiconductor element having an adhesive layer cut into a 6×6 mm piece, mounting it on a PBGA substrate (package size: 35×35 mm, core material: BT (bismaleimide-triazine) resin, solder resist: PSR4000AUS308 (Taiyo Ink Mfg. Co., Ltd.), thickness: 0.56 mm) under the conditions of bond load: 1.0 N, support heating temperature: 130° C., mounting time: 8 sec (including a time of 7 sec taken for the support surface to be heated to 130° C.), and then curing it at 150° C. for 60 min. The adhesion strength is more preferably 200 N or higher, more preferably 500 N or higher.

After the wire bonding, the resin encapsulating step is conducted. Generally, a encapsulant for transfer molding in which a filler is dispersed in an epoxy resin is used. There are no particular restrictions to a usable encapsulant for transfer molding, but those free from an antimony compound and a brominated compound are preferable in the light of environmental concerns. More preferred is a encapsulant containing a biphenyl aralkyl type epoxy resin and/or a biphenyl aralkyl type phenol resin, which is free from an antimony compound and a brominated compound. It is because a encapsulant containing a biphenyl aralkyl type epoxy resin and/or a biphenyl aralkyl type phenol resin exhibits good flame resistance (UL test) and good reflow crack resistance without an antimony compound or brominated compound.

Resin encapsulating is generally conducted at 160° C. to 180° C. Therefore, if an adhesion strength of a semiconductor element to a support after wire bonding, a semiconductor element may be detached during the resin encapsulating step or a semiconductor element may drift. Therefore, a sample for measurement of the above adhesion strength (a sample obtained by mounting a 6×6 mm piece of a semiconductor element having an adhesive layer on a PBGA substrate without curing the adhesive layer) preferably has an adhesion strength of 1 N or more at 175° C. (a typical resin encapsulating temperature). It is particularly preferably 3 N or higher. It is because an adhesion strength more than that can prevent defects such as detachment during resin encapsulating.

After resin encapsulating, post-molding curing is, if necessary, conducted and when using a lead frame as a support, lead trimming and forming and/or exterior plating are, if necessary, conducted to provide a semiconductor package. When using an organic substrate as a support, solder ball attachment is, if necessary, conducted to provide a semiconductor package.

This invention will be described with reference to examples, with the understanding that the invention is not limited to the examples.

EXAMPLES

There will be described Examples of the present invention.

Examples 1 to 4 and Comparable Examples 1 to 9

Liquid Resin Composition

Liquid Resin Composition A
Ortho-cresol novolac type epoxy resin (softening point: 70° C., epoxy equivalent: 210): 97.6 g
Phenolaralkyl resin (softening point: 75° C., hydroxyl equivalent: 175): 81.3 g
γ-Butyrolactone (boiling point: 204° C.): 120 g.
These materials were blended in a separable flask, and the mixture was stirred at 150° C. for one hour to give a pale yellow transparent liquid. The mixture was cooled to 25° C., the following materials were added, and the mixture was stirred at 25° C. for 30 min and filtrated through a 1 μm mesh to give a liquid resin composition A.
3-Glycidoxypropyltrimethoxysilane: 0.81 g
2-Phenylimidazole: 0.27 g.
The obtained liquid resin composition A had a viscosity of 3 Pa·s. A viscosity was determined using Type E viscometer (Toki Sangyo Co., Ltd., 3 degree corn) at 25° C. and 2.5 rpm (hereinafter, a viscosity was measured in the same manner).

Liquid Resin Composition B
Ortho-cresol novolac type epoxy resin (softening point: 70° C., epoxy equivalent: 210): 16.5 g
Phenolaralkyl resin (softening point: 75° C., hydroxyl equivalent: 175): 13.8 g
Acrylic polymer (ethyl acrylate/acrylonitrile/glycidyl acrylate/N,N-dimethylacrylamide=74/20/1/5 copolymer, molecular weight: 490000, Tg: 15° C.): 7.6 g
γ-Butyrolactone (boiling point: 204° C.): 62 g.
These materials were blended in a separable flask, and the mixture was stirred at 150° C. for one hour to give a pale yellow transparent liquid. The mixture was cooled to 25° C., the following materials were added, and the mixture was stirred at 25° C. for 30 min and filtrated through a 1 μm mesh to give a liquid resin composition B.
3-Glycidoxypropyltrimethoxysilane: 0.14 g
2-Phenylimidazole: 0.05 g.
The liquid resin composition B thus obtained had a viscosity of 8 Pa·s.

Liquid Resin Composition C
Ortho-cresol novolac type epoxy resin (softening point: 70° C., epoxy equivalent: 210): 16.5 g
Phenolaralkyl resin (softening point: 75° C., hydroxyl equivalent: 175): 13.7 g
Acrylic polymer (ethyl acrylate/acrylonitrile/glycidyl acrylate/N,N-dimethylacrylamide=74/20/1/5 copolymer, molecular weight: 490000, Tg: 15° C.): 7.6 g
γ-Butyrolactone (boiling point: 204° C.): 62 g.
These materials were blended in a separable flask, and the mixture was stirred at 150° C. for one hour to give a pale yellow transparent liquid. The mixture was cooled to 25° C., the following materials were added, and the mixture was stirred at 25° C. for 30 min and filtrated through a 1 μm mesh to give a liquid resin composition C.
3-Glycidoxypropyltrimethoxysilane: 0.14 g
Phosphorous-compound catalyst: 0.09 g.
Here, the phosphorous-compound catalyst was prepared as follows.
37.5 g of 4,4'-bisphenol-S (Nicca Chemical Co., Ltd., BPS-N) (0.15 mol), 41.9 g of tetraphenylphosphonium bromide (0.1 mol) and 100 mL of ion exchanged water were charged in a separable flask equipped with a stirrer and the mixture was stirred at 100° C. 4.0 g of sodium hydroxide (0.1 mol) dissolved in 50 mL of ion exchanged water was added to the undissolved mixture above. After continuing stirring for a while, a white precipitate was formed. The precipitate was filtered and dried to give white crystals (68.5 g) which was used as a catalyst.
The liquid resin composition C thus obtained had a viscosity of 8 Pa·s.

Liquid Resin Composition D
Bisphenol-A type epoxy resin (liquid at 25° C., epoxy equivalent: 185): 30.6 g
Phenolaralkyl resin (softening point: 75° C., hydroxyl equivalent: 175): 29.0 g
γ-Butyrolactone (boiling point: 204° C.): 40 g.
These materials were blended in a separable flask, and the mixture was stirred at 150° C. for one hour to give a pale yellow transparent liquid. The mixture was cooled to 25° C., the following materials were added, and the mixture was stirred at 25° C. for 30 min and filtrated through a 1 μm mesh to give a liquid resin composition D.

3-Glycidoxypropyltrimethoxysilane: 0.27 g
2-Phenylimidazole: 0.09 g.

The liquid resin composition D thus obtained had a viscosity of 2 Pa·s.

Liquid Resin Composition E

Ortho-cresol novolac type epoxy resin (softening point: 90° C., epoxy equivalent: 210): 31.0 g Phenolaralkyl resin (softening point: 75° C., hydroxyl equivalent: 175): 25.9 g γ-Butyrolactone (boiling point: 204° C.): 40 g.

These materials were blended in a separable flask, and the mixture was stirred at 150° C. for one hour to give a pale yellow transparent liquid. The mixture was cooled to 25° C., the following materials were added, and the mixture was stirred at 25° C. for 30 min and filtrated through a 1 μm mesh to give a liquid resin composition E.

3-Glycidoxypropyltrimethoxysilane: 0.26 g
2-Methylimidazole: 2.84 g.

The liquid resin composition E thus obtained had a viscosity of 5 Pa·s.

Liquid Resin Composition F

Ortho-cresol novolac type epoxy resin (softening point: 90° C., epoxy equivalent: 210): 38.4 g Polypara-vinylphenol resin (Maruzen Petrochemical Co., Ltd., MARUKA LYNCUR-M): 21.2 g γ-Butyrolactone (boiling point: 204° C.): 40 g.

These materials were blended in a separable flask, and the mixture was stirred at 150° C. for one hour to give a pale yellow transparent liquid. The mixture was cooled to 25° C., the following materials were added, and the mixture was stirred at 25° C. for 30 min and filtrated through a 1 μm mesh to give a liquid resin composition F.

3-Glycidoxypropyltrimethoxysilane: 0.27 g
2-Phenylimidazole: 0.09 g.

The liquid resin composition F thus obtained had a viscosity of 6 Pa·s.

Liquid Resin Composition G

Ortho-cresol novolac type epoxy resin (softening point: 70° C., epoxy equivalent: 210): 16.5 g Phenolaralkyl resin (softening point: 75° C., hydroxyl equivalent: 175): 13.8 g Acrylic polymer (ethyl acrylate/acrylonitrile/glycidyl acrylate/N,N-dimethylacrylamide=74/20/1/5 copolymer, molecular weight: 490000, Tg: 15° C.): 7.6 g Diethyleneglycol monobutyl ether acetate (boiling point: 247° C.): 62 g.

These materials were blended in a separable flask, and the mixture was stirred at 150° C. for one hour to give a pale yellow transparent liquid. The mixture was cooled to 25° C., the following materials were added, and the mixture was stirred at 25° C. for 30 min and filtrated through a 1 μm mesh to give a liquid resin composition G.

3-Glycidoxypropyltrimethoxysilane: 0.14 g
2-Phenylimidazole: 0.05 g.

The liquid resin composition G thus obtained had a viscosity of 9 Pa·s.

Liquid Resin Composition H

Ortho-cresol novolac type epoxy resin (softening point: 70° C., epoxy equivalent: 210): 12.2 g Phenoxy resin (InChem Corporation, PKHC): 12.2 g γ-Butyrolactone (boiling point: 204° C.): 75 g.

These materials were blended in a separable flask, and the mixture was stirred at 150° C. for one hour to give a pale yellow transparent liquid. The mixture was cooled to 25° C., the following materials were added, the mixture was stirred at 25° C. for 30 min, and since filtration of the mixture through a 1 μm mesh was unsuccessful due to clogging, the product was used as a resin composition H without filtration.

3-Glycidoxypropyltrimethoxysilane: 0.11 g
Dicyandiamide (reagent grade): 0.49 g.

The liquid resin composition H thus obtained had a viscosity of 11 Pa·s.

20 mg of each liquid resin compositions A to H was dissolved in 6 mL of tetrahydrofuran (hereinafter, referred to as THF) one by one, and the mixture was subjected to GPC measurement. GPC measurement was conducted using Waters Alliance (2695 Separations Module, 2414 Reflective Index Detector, TSK Gel GMHHR-Lx2+TSK Guard Column HHR-Lx1, mobile phase: THF, 1.0 mL/min) under the conditions of a column temperature: 40.0° C., an inside temperature of a differential refractive index detector: 40.0° C., and a sample injection volume: 100 mL. A molecular-weight calibration curve was obtained using Shodex Standard SL-105 (Showa Denko K. K.). For the GPC chart, a ratio of an area (b) of a molecular weight of 200 or more and 5000 or less to an area (a) of a molecular weight of 200 or more (b/a) was calculated.

On two 6-inch wafers was applied one of liquid resin compositions A to H by spin coating to such a thickness that a thickness after application became 50±5 μm, and the wafers were heated in an oven at 120° C. for 10 min to give wafers having a compound layer. Spin coating was conducted using a spin coater (Mikasa Co., Ltd, 1H-DX). A thickness after spin coating was measured by a noncontact thickness meter and when the thickness was not in the range of 50±5 μm, the spin coating conditions were adjusted to obtain the thickness within the above range.

A part of the dried compound layer on first wafer for each samples was scraped up from by a spatula immediately after heating for volatile content checking. A volatile content is a weight-loss rate at 200° C. measured by TGA (thermogravimetric analysis) elevating its temperature from 25° C. at a rate of 10° C./min for 10 mg of the sample. Sampling was conducted immediately after heating because after the sample is cooled to 25° C., the compound layer becomes a solid, which makes sampling difficult. The remaining part after sampling was visually checked for its appearance. Its appearance was checked for the numbers of pinholes, voids and foreign materials. In terms of measuring a thickness of the compound layer, a contact thickness gauge was used to determine the total thickness of the wafer and the compound layer, from which the thickness of the wafer preliminarily measured was subtracted to calculate the thickness of the compound layer Furthermore, in terms of thickness precision, a laser three-dimensional measuring instrument (Hitachi Tsuchiura Engineering Co., Ltd.) was used and measurement was conducted on a line of 150 mm length, which passing through the center of the wafer but not the part used for volatile content sampling.

Next, the wafer having a compound layer was mounted on a dicing sheet (Sumitomo Bakelite Co., Ltd., FSL-N4003) and diced into semiconductor pieces. Some of the semiconductor dies were manually peeled from the dicing sheet and tested their tackiness at the compound layer at 25° C. and 80° C. A tackiness was measured using a tackiness tester (RHESCA Company Ltd.) under the conditions of probe descending speed (Immersion Speed): 30 mm/min, test speed: 600 mm/min, adhesion load (Preload): 0.2 N, adhesion holding time (Press Time): 1.0 sec. and probe: 5.1 mmμ (SUS304).

Three semiconductor dies having a compound layer which were manually peeled as described above were immersed in 6 mL of THF and allowed to be permeated at 25° C. for 60 min to give samples for GPC measurement. A GPC chart obtained from measurement as described above was used to calculate a ratio of an area (b') of a molecular weight of 200 or more and 5000 or less to an area (a') of a molecular weight of 200 or more (b'/a'), which was then used to calculate [(b'/a')/(b/a)].

The measurement results are shown in Table 1.

Example 1

A semiconductor element having a compound layer prepared using the above liquid resin composition A (the first semiconductor wafer was diced into 6×6 mm semiconductor dies) was used for the following tests. The second semiconductor wafer was diced into 10×10 mm pieces.

Adhesion Force

A wafer having a compound layer diced into a 6×6 mm piece was placed in a die bonder, picked up under the conditions of ejector pin height: 350 μm (the height of the lower surface of a dicing film is "0") and pickup time: 500 ms, mounted on a PBGA substrate (package size: 35×35 mm, core material: BT (bismaleimide-triazine) resin, solder resist: PSR4000AUS308 (Taiyo Ink Mfg. Co., Ltd.), thickness: 0.56 mm) under the conditions of bonding force: 1.0 N and a substrate heating temperature: 130° C. for 8 sec (including a time of 7 sec taken for the substrate surface to be heated to 130° C.), and then cured at 150° C. for 60 min. An adhesion force of the sample after mounting (before curing) was measured at 25° C. and an adhesion force of the sample after curing was measured at 175° C. An adhesion force was measured using a die shear tester (Dage Holdings Ltd., Series 4000).

Voids and Initial Delamination

A semiconductor element having a compound layer cut into a 10×10 mm piece was placed in a die bonder, picked up under the conditions of ejector pin height: 350 μm (the height of the lower surface of a dicing film is "0") and pickup time: 500 ms, mounted on a PBGA substrate (package size: 35×35 mm, core material: BT (bismaleimide-triazine) resin, solder resist: PSR4000AUS308 (Taiyo Ink Mfg. Co., Ltd.), thickness: 0.56 mm) under the conditions of bond load: 2.9 N and support heating temperature: 130° C. for 8 sec (including a temperature-rising time), and then cured at 150° C. for 60 min. Then, the product was sealed with an epoxy encapsulating resin containing a phenylaralkyl epoxy (Sumitomo Bakelite Co., Ltd., EME-G770) and post-mold cured at 175° C. for 4 hours. The PBGA package after post-mold curing was observed by a scanning acoustic tomograph to determine the presence of voids and initial delamination. Voids and initial delamination were determined as a percentage (%) of an area of the ultrasound impermeable part (black part) to an area of the chip.

Solder Reflow Test

The packages after observing voids and initial delamination were soaked for 168 hours at 85° C. and 60% RH. Then, it was passed three times through an IR reflow apparatus which was set such that a time at 260° C. or more was 10 sec or more. Then, it was observed for crack formation by a scanning acoustic tomograph. Evaluation was conducted as the number of the packages having cracks in 4 packages.

The measurement results are shown in Table 1.

Example 2

A test was conducted as described in Example 1, using a wafer having a compound layer prepared by the above liquid resin composition B.

Example 3

A test was conducted as described in Example 1, using a wafer having a compound layer prepared by the above liquid resin composition C.

Example 4

The liquid resin composition A was spin-coated on two 6 inch wafers, which were then heated at 120° C. for 10 min to give wafers having a compound layer. Spin coating was conducted under the conditions shown in Table 1 and the evaluation results are shown in Table 1.

Comparable Examples 1 to 4

The liquid resin composition A was spin-coated on two 6 inch wafers, which were then heated to give wafers having a compound layer. Spin coating and heating were conducted under the conditions shown in Table 1 and the evaluation results are shown in Table 1.

In Comparative Examples 1 and 2, a part of a compound layer remained on a dicing sheet when a semiconductor element having a compound layer diced into 6×6 mm for tackiness measurement was manually peeled from the dicing sheet. Furthermore, since picking up could not be conducted under the conditions in Example 1 when preparing a sample for measuring an adhesion force, the conditions were changed to ejector pin height: 500 μm and pick-up time: 3 sec. A residual compound layer was observed on the dicing sheet after picking up. Furthermore, since picking up could not be conducted under the conditions in Example 1 when assembling a PBGA for solder reflow testing, the conditions were changed to ejector pin height: 700 μm and pickup time: 3 sec. A residual compound layer was observed on the dicing sheet after picking up.

In Comparative Example 4, since a wafer could not be mounted on a PBGA substrate under the conditions in Example 1 when preparing a sample for measuring an adhesion force (a chip together with the compound layer dropped when the substrate was tilted after mounting), the conditions were changed to bond load: 10.0 N, and support heating temperature: 160° C. for 8 sec (including temperature rising). Furthermore, since a wafer could not be mounted on a PBGA substrate under the conditions in Example 1 when assembling a PBGA for solder reflow testing (a chip together with the compound layer dropped when the substrate was tilted after mounting), the conditions were changed to bonding force: 10.0 N and support heating temperature: 160° C. for 8 sec (including a temperature-rising time), but scanning by a transmission ultrasonic test equipment for observing voids and initial delamination indicated drift of the semiconductor die, so that voids, initial delamination or solder reflow could not be evaluated.

Comparative Example 5

A test was conducted as described in Example 1, using a wafer having a compound layer prepared using the above liquid resin composition D. A part of a compound layer remained on a dicing sheet when a semiconductor element having a compound layer diced into 6×6 mm for tackiness measurement was manually peeled from the dicing sheet. Furthermore, since picking up could not conducted under the conditions in Example 1 when preparing a sample for measuring an adhesion force, the conditions were changed to ejector pin height: 500 μm and pick-up time: 3 sec. A residual compound layer was observed on the dicing sheet after picking up. Furthermore, since picking up could not be conducted under the conditions in Example 1 when assembling a PBGA for solder reflow testing, the conditions were changed to ejector pin height: 700 μm and pickup time: 3 sec. A residual compound layer r was observed on the dicing sheet after picking up.

Comparative Examples 6 and 7

A test was conducted as described in Example 1 using wafers having a compound layer prepared using the above liquid resin compositions E and F.

Comparative Example 8

A test was conducted as described in Example 1 using a wafer having a compound layer prepared using the above liquid resin composition G. A part of a compound layer remained on a dicing sheet when a semiconductor element having a compound layer diced into 6×6 mm for tackiness measurement was manually peeled from the dicing sheet. Furthermore, since picking up could not conducted under the conditions in Example 1 when preparing a sample for measuring an adhesion force, the conditions were changed to ejector pin height: 500 μm and pick-up time: 3 sec. A residual compound layer was observed on the dicing sheet after picking up. Furthermore, since picking up could not be conducted under the conditions in Example 1 when assembling a PBGA for solder reflow testing, the conditions were changed to ejector pin height: 700 μm and pickup time: 3 sec. A residual compound layer was observed on the dicing sheet after picking up.

Comparative Example 9

A test was conducted as described in Example 1 using a semiconductor element having a compound layer prepared using the above liquid resin composition H. Since a wafer could not be mounted on a PBGA substrate under the conditions in Example 1 when preparing a sample for measuring an adhesion force (a chip together with the compound layer dropped when the substrate was tilted after mounting), the conditions were changed to bonding force: 10.0 N, and support heating temperature: 160° C. for 8 sec (including temperature rising). Furthermore, since a wafer could not be mounted on a PBGA substrate under the conditions in Example 1 when assembling a PBGA for solder reflow testing (a chip together with the compound layer dropped when the substrate was tilted after mounting), the conditions were changed to bonding force: 10.0 N and support heating temperature: 160° C. for 8 sec (including temperature-rising), but scanning acoustic tomograph for observing voids and initial delamination indicated drift of the semiconductor die, so that voids, initial delamination or solder reflow could not be evaluated.

In Example 1, the volatile content after heating was small, and an appearance and a thickness precision were satisfactory. A tackiness was 0.02 N and 1.8 N at 25° C. and 80° C., respectively, pickup properties were good, there were no voids, and no cracks were observed after solder reflow.

In Example 2, the volatile content after heating was small, and an appearance and a thickness precision were satisfactory. A tackiness was 0.02 N and 1.5 N at 25° C. and 80° C., respectively, pickup properties were good, there were no voids, and no cracks were observed after solder reflow.

In Example 3, the volatile content after heating was small, and an appearance and a thickness precision were satisfactory. A tackiness was 0.02 N and 1.5 N at 25° C. and 80° C., respectively, pickup properties were good, there were no voids, and no cracks were observed after solder reflow.

In Example 4, a thicker compound layer was formed by changing the spin coating conditions. The volatile content after heating was small, and an appearance and a thickness precision were satisfactory. A tackiness was 0.02 N and 2.0 N at 25° C. and 80° C., respectively, pickup properties were good, there were no voids, and no cracks were observed after solder reflow.

In Comparative Example 1, the heating conditions were changed to 80° C. and 30 min. An appearance and thickness precision were good and a volatile content was 2.3% by weight. A tackiness was 0.08 N and 2.0 N at 25° C. and 80° C., respectively, but pickup properties were poor, voids were observed because a part of the compound layer was taken by the dicing sheet during picking up, and cracks were observed after solder reflow.

In Comparative Example 2, the heating conditions were changed to 100° C. and 10 min. An appearance and thickness precision were good and a volatile content was 1.3% by weight. A tackiness was 0.10 N and 2.5 N at 25° C. and 80° C., respectively, but pickup properties were poor, voids were observed because a part of the adhesive layer was taken by the dicing sheet during picking up, and cracks were observed after solder reflow.

In Comparative Example 3, the heating conditions were changed to 120° C. for 60 min, and the volatile content after heating was small, a tackiness was 0.02 N and 0.10 N at 25° C. and 80° C., respectively and pickup properties were good, but initial delamination (poor wetness) occurred and cracks were observed after solder reflow.

In Comparative Example 4, the heating conditions were changed to 150° C. for 10 min, and the amount of volatiles after heating was small, a tackiness was 0.02 N and 0.02 N at 25° C. and 80° C., respectively and pickup properties were good, but mounting properties on a PBGA substrate was insufficient and although the mounting conditions were changed, an adhesion force was too weak to prevent a semiconductor die from drifting during molding.

In Comparative Example 5, the volatile content after heating was small and an appearance and thickness precision were good. A tackiness at 25° C. and 80° C. was 0.15 N and 2.3 N, respectively, pickup properties were poor, voids were observed because a part of the compound layer was taken by the dicing sheet during picking up and cracks were observed after solder reflow.

In Comparative Example 6, the amount of volatiles after heating was small and an appearance and thickness precision were good. A tackiness at 25° C. and 80° C. was 0.02 N and 0.5 N, respectively and pickup properties were good, but initial delamination (poor wetness) occurred and cracks were observed after solder reflow.

In Comparative Example 7, the volatile content after heating was small and an appearance and thickness precision were good. A tackiness at 25° C. and 80° C. was 0.02 N and 0.2 N, respectively and pickup properties were good, but initial delamination (poor wetness) occurred and cracks were observed after solder reflow.

In Comparative Example 8, an appearance and thickness precision were good, but the amount of volatiles after heating was 2.0% by weight. A tackiness at 25° C. and 80° C. was 0.08 N and 2.1 N, respectively and pickup properties were poor, voids were observed because a part of the compound layer was taken by the dicing sheet during picking up and volatiles adversely affect, and cracks were observed after solder reflow.

In Comparative Example 9, since a solid was contained, granular parts were observed in the surface after spin coating and an uneven pattern from the granular parts toward the periphery was observed. Thickness precision was, therefore, poor. The volatile content after heating was small, but a tackiness was 0.02 N and 0.1 N at 25° C. and 80° C., respectively, pickup properties were good, but mounting properties on a PBGA substrate was poor and although the mounting conditions were changed, an adhesion force was too weak to prevent drift of the semiconductor die during molding.

Phenolaralkyl resin (molecular weight: 612, softening point: 75° C., hydroxyl equivalent: 175): 12.6 g
Polyhydroxystyrene (molecular weight: 2080, dispersion degree: 1.26): 12.6 g
γ-Butyrolactone (boiling point: 204° C.): 37.4 g.

These materials were blended in a separable flask, and the mixture was stirred at 150° C. for one hour to give a pale yellow transparent liquid. The mixture was cooled to 25° C., the following materials were added, and the mixture was stirred at 25° C. for 30 min and filtrated through a 1 μm mesh to give a liquid resin composition I.
3-Glycidoxypropyltrimethoxysilane: 0.28 g
2-Phenylimidazole: 0.09 g.

TABLE 1

|  |  | Example |  |  |  | Comparable Example |  |  |
|---|---|---|---|---|---|---|---|---|
|  |  | 1 | 2 | 3 | 4 | 1 | 2 | 3 |
| Resin composition |  | A | B | C | A | A | A | A |
| Viscosity | Pa·s | 3 | 8 | 8 | 3 | 3 | 3 | 3 |
| GPC area(B/A) |  | — | 0.98 | 0.87 | 0.86 | 0.98 | 0.98 | 0.98 |
| Spin coating Rotation No. | rpm | 1500 | 1800 | 1800 | 700 | 1500 | 1500 | 1500 |
| conditions Time | sec | 40 | 40 | 40 | 30 | 40 | 40 | 40 |
| Thickness after spin coating | μm | 52 | 49 | 48 | 78 | 51 | 52 | 52 |
| Drying Temperature | ° C. | 120 | 120 | 120 | 120 | 80 | 100 | 120 |
| conditions Time | min | 10 | 10 | 10 | 10 | 30 | 10 | 60 |
| Thickness after drying | μm | 32 | 24 | 22 | 35 | (25)* | (28)* | 31 |
| Volatiles | wt % | 0.1 | 0.1 | 0.1 | 0.1 | 2.3 | 1.3 | 0.1 |
| Appearance | — | Good | Good | Good | Good | Good | Good | Good |
| Thickness precision | μm | ±3 | ±2 | ±2 | ±3 | ±3 | ±3 | ±3 |
| GPC area(B'/A') | — | 0.89 | 0.70 | 0.67 | 0.90 | 0.94 | 0.92 | 0.65 |
| GPC area(B'/A')/(B/A) | — | 0.91 | 0.80 | 0.78 | 0.92 | 0.96 | 0.94 | 0.66 |
| Tackiness 25° C. | N | 0.02 | 0.02 | 0.02 | 0.02 | 0.08 | 0.10 | 0.02 |
| 80° C. | N | 1.8 | 1.5 | 1.5 | 2.0 | 2.0 | 2.5 | 0.1 |
| Adhesion 25° C. | N | 130 | 100 | 100 | 80 | 5 | 10 | 2 |
| force 175° C. | N | 500< | 500< | 500< | 500< | 500< | 500< | 10 |
| Void, initial delamination | % | <10 | <10 | <10 | <10 | 50< | 50< | 50< |
| Solder reflow | No. | 0 | 0 | 0 | 0 | 4 | 4 | 4 |

|  |  | Comparable Example |  |  |  |  |  |
|---|---|---|---|---|---|---|---|
|  |  | 4 | 5 | 6 | 7 | 8 | 9 |
| Resin composition |  | A | D | E | F | G | H |
| Viscosity | Pa·s | 3 | 2 | 5 | 6 | 9 | 11 |
| GPC area(B/A) | — | 0.98 | 0.98 | 0.95 | 0.58 | 0.86 | 0.54 |
| Spin coating Rotation No. | rpm | 1500 | 1200 | 1600 | 1800 | 1800 | 1500 |
| conditions Time | sec | 40 | 30 | 40 | 40 | 40 | 40 |
| Thickness after spin coating | μm | 51 | 53 | 48 | 48 | 50 | 52 |
| Drying Temperature | ° C. | 150 | 120 | 120 | 120 | 120 | 120 |
| conditions Time | min | 10 | 10 | 10 | 10 | 10 | 10 |
| Thickness after drying | μm | 31 | (20)* | 30 | 28 | 28 | 18 |
| Volatiles | wt % | 0.1 | 0.1 | 0.1 | 0.1 | 2.0 | 0.1 |
| Appearance | — | Good | Good | Good | Good | Good | Rough |
| Thickness precision | μm | ±3 | ±3 | ±3 | ±3 | ±3 | ±6 |
| GPC area(B'/A') | — | NA** | 0.88 | 0.60 | 0.52 | 0.66 | 0.51 |
| GPC area(B'/A')/(B/A) | — | NA** | 0.90 | 0.63 | 0.90 | 0.77 | 0.94 |
| Tackiness 25° C. | N | 0.02 | 0.15 | 0.02 | 0.02 | 0.08 | 0.02 |
| 80° C. | N | 0.02 | 2.3 | 0.5 | 0.2 | 2.1 | 0.1 |
| Adhesion 25° C. | N | <1 | 10 | 30 | 10 | 20 | <1 |
| force 175° C. | N | <1 | 500< | 250 | 300 | 100 | <1 |
| Void, initial delamination | % | NA*** | 50< | 50< | 50< | 50< | NA*** |
| Solder reflow | No. | NA*** | 2 | 4 | 4 | 4 | NA*** |

*A measured value was reduced due to deformation of an adhesive layer during thickness measurement.
**Not measured due to insolublity in THF
***Not evaluated due to drift of a chip during molding Examples 5 to 11 and Comparative Example 10

There will be described Examples 5 to 11 and Comparative Example 10.
Preparation of a Liquid Resin Composition
Liquid Resin Composition I
Ortho-cresol novolac type epoxy resin (softening point: 70° C., epoxy equivalent: 210): 37.1 g The obtained liquid resin composition I had a viscosity of 4 Pa·s. A viscosity was determined using Type E viscometer (Toki Sangyo Co., Ltd., 3 degree corn) at 25° C. and 2.5 rpm (hereinafter, a viscosity was measured in the same manner).
Liquid Resin Composition J
Ortho-cresol novolac type epoxy resin (softening point: 70° C., epoxy equivalent: 210): 17.4 g Phenolaralkyl resin (molecular weight: 612, softening point: 75° C., hydroxy equivalent: 175): 5.9 g Polyhydroxystyrene (molecular weight: 2080, dispersion degree: 1.26): 5.9 g Acrylic polymer (ethyl acrylate/acrylonitrile/glycidyl acrylate/N,N-dimethylacrylamide=74/20/1/5 copolymer, molecular weight: 490000, Tg: 15° C.): 9.6 g γ-Butyrolactone (boiling point: 204° C.): 60.9 g.

These materials were blended in a separable flask, and the mixture was stirred at 150° C. for one hour to give a pale yellow transparent liquid. The mixture was cooled to 25° C., the following materials were added, and the mixture was stirred at 25° C. for 30 min and filtrated through a 1 μm mesh to give a liquid resin composition J.

3-Glycidoxypropyltrimethoxysilane: 0.13 g

2-Phenylimidazole: 0.04 g.

The liquid resin composition J thus obtained had a viscosity of 12 Pa·s.

Liquid Resin Composition K

Ortho-cresol novolac type epoxy resin (softening point: 70° C., epoxy equivalent: 210): 19.4 g Dicyclopentadiene type epoxy resin (softening point: 60° C., epoxy equivalent: 263): 19.4 g Phenolaralkyl resin (molecular weight: 612, softening point: 75° C., hydroxy equivalent: 175): 11.8 g Polyhydroxystyrene (molecular weight: 2080, dispersion degree: 1.26): 11.8 g γ-Butyrolactone (boiling point: 204° C.): 37.2 g.

These materials were blended in a separable flask, and the mixture was stirred at 150° C. for one hour to give a pale yellow transparent liquid. The mixture was cooled to 25° C., the following materials were added, and the mixture was stirred at 25° C. for 30 min and filtrated through a 1 μm mesh to give a liquid resin composition K.

3-Glycidoxypropyltrimethoxysilane: 0.28 g

2-Phenylimidazole: 0.09 g.

The liquid resin composition K thus obtained had a viscosity of 4 Pa·s.

Liquid Resin Composition L

Ortho-cresol novolac type epoxy resin (softening point: 70° C., epoxy equivalent: 210): 36.9 g Phenolaralkyl resin (molecular weight: 612, softening point: 75° C., hydroxy equivalent: 175): 15.6 g Polyhydroxystyrene (molecular weight: 2080, dispersion degree: 1.26): 10.4 g γ-Butyrolactone (boiling point 204° C.): 36.7 g.

These materials were blended in a separable flask, and the mixture was stirred at 150° C. for one hour to give a pale yellow transparent liquid. The mixture was cooled to 25° C., the following materials were added, and the mixture was stirred at 25° C. for 30 min and filtrated through a 1 μm mesh to give a liquid resin composition L.

3-Glycidoxypropyltrimethoxysilane: 0.28 g

2-Phenylimidazole: 0.09 g.

The liquid resin composition L thus obtained had a viscosity of 5 Pa·s.

Liquid Resin Composition M

Ortho-cresol novolac type epoxy resin (softening point: 70° C., epoxy equivalent: 210): 36.9 g Phenolaralkyl resin (molecular weight: 612, softening point: 75° C., hydroxy equivalent: 175): 15.6 g Polyhydroxystyrene (molecular weight: 2080, dispersion degree: 1.26): 10.4 g γ-Butyrolactone (boiling point 204° C.): 36.6 g.

These materials were blended in a separable flask, and the mixture was stirred at 150° C. for one hour to give a pale yellow transparent liquid. The mixture was cooled to 25° C., the following materials were added, and the mixture was stirred at 25° C. for 30 min and filtrated through a 1 μm mesh to give a liquid resin composition M.

3-Glycidoxypropyltrimethoxysilane: 0.28 g

Phosphorous-containing catalyst: 0.19 g.

Here, the phosphorous-containing catalyst was prepared as follows.

In a separable flask equipped with a stirrer were charged 37.5 g of 4,4'-bisphenol-S (Nicca Chemical Co., Ltd., BPS-N) (0.15 mol), 41.9 g of tetraphenylphosphonium bromide (0.1 mol) and 100 mL of ion-exchanged water and the mixture was stirred at 100° C. To the mixture still containing an undissolved material was added a solution of 4.0 g of sodium hydroxide (0.1 mol) dissolved in 50 mL of ion-exchanged water. After continuing stirring for a while, a white precipitate was formed. The precipitate was filtered and dried to give white crystals (68.5 g) which was used as a catalyst.

The liquid resin composition M thus obtained had a viscosity of 5 Pa·s.

Liquid Resin Composition N

Ortho-cresol novolac type epoxy resin (softening point: 70° C., epoxy equivalent: 210): 37.7 g Polyhydroxystyrene (molecular weight: 1850, dispersion degree: 2.41): 21.5 g γ-Butyrolactone (boiling point 204° C.): 40.4 g.

These materials were blended in a separable flask, and the mixture was stirred at 150° C. for one hour to give a pale yellow transparent liquid. The mixture was cooled to 25° C., the following materials were added, and the mixture was stirred at 25° C. for 30 min and filtrated through a 1 μm mesh to give a liquid resin composition N.

3-Glycidoxypropyltrimethoxysilane: 0.27 g

2-Phenylimidazole: 0.09 g.

The liquid resin composition N thus obtained had a viscosity of 13 Pa·s.

Example 5

20 mg of a liquid resin composition I was dissolved in 6 mL of tetrahydrofuran (hereinafter, referred to as THF), and the mixture was subjected to GPC measurement. GPC measurement was conducted using Waters Alliance (2695 Separations Module, 2414 Reflective Index Detector, TSK Gel GMHHR-Lx2+TSK Guard Column HHR-Lx1, mobile phase: THF, 1.0 mL/min) under the conditions of a column temperature: 40.0° C., an inside temperature of a differential refractive index detector: 40.0° C., and a sample injection volume: 100 μL. A molecular-weight calibration curve was obtained using Shodex Standard SL-105 (Showa Denko K. K.). For the GPC chart, a ratio of an area (b) of a molecular weight of 200 or more and 5000 or less to an area (a) of a molecular weight of 200 or more (b/a) was calculated.

On a 6 inch wafer (bare silicon—no circuit on it, thickness: 625 μm) and a 8 inch wafer (having an aluminum pad containing 5% of copper and passivation layer is SiN, thickness: 350 μm) was applied a liquid resin composition I by spin coating to such a thickness that a thickness after application became 50±5 μm, and the wafers were heated in an oven controlled at 120° C. for 10 min to give wafers having an adhesive layer. Spin coating was conducted using a spin coater (Mikasa Co., Ltd, 1H-DX). A thickness after spin coating was measured by a noncontact thickness indicator and when the thickness was less than 50±5 μm, the spin coating conditions were adjusted to obtain the thickness within the above range.

For the 6 inch wafer, a part of the adhesive layer was collected by a spatula immediately after heating, to provide a sample for volatile content measurement. A volatile content is a weight-loss rate at 200° C. measured by TGA (thermogravimetric analysis) elevating its temperature from 25° C. at a rate of 10° C./min for 10 mg of the sample. Sampling was conducted immediately after heating, because after the sample is cooled to 25° C., the adhesive layer becomes a solid, which makes sampling difficult. The remaining part after sampling was visually checked for its appearance. Its appearance was checked for the numbers of pinholes, voids and foreign materials. In terms of measuring a thickness of the adhesive layer, a contact thickness gauge was used to determine the total thickness of the wafer and the adhesive layer, from which the thickness of the wafer preliminarily measured was subtracted to calculate the thickness of the adhesive layer. Furthermore, in terms of thickness precision, a laser three-dimensional measuring instrument (Hitachi Tsuchiura Engineering Co., Ltd.) was used and measurement was conducted on a line of 150 mm length, which passing through the center of the wafer but not the part used for volatile content sampling.

Next, the 6 inch and the 8 inch wafers having an adhesive layer were bonded to a dicing sheet (Sumitomo Bakelite Co., Ltd., FSL-N4003) and cut into 6×6 mm and 10.5×10.5 mm pieces, respectively. A part of the 6 inch wafer as a 6×6 mm piece was manually peeled from the dicing sheet and used for tackiness measurement of the adhesive layer at 25° C. and 80° C. A tackiness was measured using a tackiness tester (RHESCA Company Ltd.) under the conditions of probe descending speed (Immersion Speed): 30 mm/min, test speed: 600 mm/min, adhesion load (Preload): 0.2 N, adhesion holding time (Press Time): 1.0 sec. and probe: 5.1 mmµ (SUS304).

Three semiconductor dies having an adhesive layer diced into 6×6 mm pieces which were manually peeled as described above were immersed in 6 mL of THF and allowed to be permeated at 25° C. for 60 min to give samples for GPC measurement. A GPC chart obtained from measurement as described above was used to calculate a ratio of an area (b') of a molecular weight of 200 or more and 5000 or less to an area (a') of a molecular weight of 200 or more (b'/a'), which was then used to calculate [(b'/a')/(b/a)].

The following items were evaluated as described later.
Adhesion Force

A wafer having an adhesive layer diced into a 6×6 mm piece was placed in a die bonder, picked up under the conditions of ejector pin height: 350 µm (the height of the lower surface of a dicing film is "0") and pickup time: 500 ms, mounted on a PBGA substrate (package size: 35×35 mm, core material: BT (bismaleimide-triazine), solder resist: PSR4000AUS308 (Taiyo Ink Mfg. Co., Ltd.), thickness: 0.56 mm) under the conditions of bonding force: 1.0 N and substrate heating temperature: 130° C. for 8 sec (including a time of 7 sec taken for the substrate surface to be heated to 130° C.). An adhesion force of the sample after mounting (without curing) was measured at 25° C., 130° C. and 175° C. An adhesion force was measured using a die shear tester (Dage Holdings Ltd., Series 4000).
Voids and Initial Delamination A wafer having an adhesive layer diced into a 10.5×10.5 mm piece was placed in a die bonder, picked up under the conditions of ejector pin height: 350 µm (the height of the lower surface of a dicing film is "0") and pickup time: 500 ms, mounted on a PBGA substrate (package size: 35×35 mm, core material: BT (bismaleimide-triazine), solder resist: PSR4000AUS308 (Taiyo Ink Mfg. Co., Ltd.), thickness: 0.56 mm) under the conditions of bonding force: 2.9 N and substrate heating temperature: 130° C. for 8 sec (including a temperature-rising time), and then, wire bonding was conducted under the following conditions (without curing).

Wire bonder: Eagle60 (ASM International N. V.)
Gold wire: SGS-H, 25 µm (Sumitomo Metal Mining Co., Ltd.)
Wire-bonding temperature: 130° C.
Bonding force: 45 g
Ultrasonic power: 120 (128 kHz).

After the wire bonding, the product was sealed with an epoxy encapsulating resin containing a biphenylaralkyl epoxy (Sumitomo Bakelite Co., Ltd., EME-G770) and post-mold cured at 175° C. for 4 hours. The PBGA package after post-mold curing was observed by a scanning acoustic tomograph to determine the presence of voids and incipient detachment. Voids and initial delamination were determined as a percentage of an area of the ultrasound impermeable part (black part) to an area of the chip.
Solder Reflow Test The package after observing voids and initial delamination was soaked at 85° C. and 60% RH for 168 hours, and then, it was passed three times through an IR reflow apparatus which was set such that a time at 260° C. or more was 10 sec or more. Then, it was observed for crack formation by a scanning acoustic tomograph. Evaluation was conducted as the number of the packages having cracks in 4 packages.

The measurement results are shown in Table 1.

Example 6

Evaluation was conducted as described in Example 5, except the above liquid resin composition J was used.

Example 7

Evaluation was conducted as described in Example 5, except the above liquid resin composition K was used.

Example 8

Evaluation was conducted as described in Example 5, except the above liquid resin composition L was used.

Example 9

Evaluation was conducted as described in Example 5, except the above liquid resin composition M was used.

Comparative Example 10

Evaluation was conducted as described in Example 5, using the above liquid resin composition N.

In Comparative Example 10, since a wafer could not be mounted on a PBGA substrate under the conditions in Example 1 when preparing a sample for measuring an adhesion force (a chip together with the adhesive dropped when the substrate was tilted after mounting), the conditions were changed to bonding force: 20.0 N and substrate heating temperature: 200° C. for 17 sec (including a temperature-rising time). Furthermore, since a wafer could not be mounted on a PBGA substrate under the conditions in Example 1 when assembling a PBGA for solder reflow testing (a chip together with the adhesive dropped when the substrate was tilted after mounting), the conditions were changed to bonding force: 20.0 N and substrate heating temperature: 200° C. for 17 sec (including a temperature-rising time).

The evaluation results are shown in Table 2.

In Example 5, the volatile content after spin coating/heating was small, and an appearance and a thickness precision were satisfactory. A tackiness was 0.02 N and 1.8 N at 25° C. and 80° C., respectively, pickup properties were good, and wire bonding could be conducted without curing after mounting a semiconductor die. In the package after molding, there were no voids or delamination, and no cracks were observed after solder reflow.

In Example 6, the amount volatiles after spin coating/heating was small, and an appearance and a thickness precision were satisfactory. A tackiness was 0.02 N and 3.0 N at 25° C. and 80° C., respectively, pickup properties were good, and wire bonding could be conducted without curing after mounting a semiconductor die. In the package after encapsulating, there were no voids or delamination, and no cracks were observed after solder reflow.

In Example 7, the volatile content after spin coating/heating was small, and an appearance and a thickness precision were satisfactory. A tackiness was 0.02 N and 1.5 N at 25° C. and 80° C., respectively, pickup properties were good, and wire bonding could be conducted without curing after mounting a semiconductor die. In the package after encapsulating, there were no voids or delamination, and no cracks were observed after solder reflow.

In Example 8, the volatile content after spin coating/heating was small, and an appearance and a thickness precision were satisfactory. A tackiness was 0.02 N and 2.3 N at 25° C. and 80° C., respectively, pickup properties were good, and wire bonding could be conducted without curing after mounting a semiconductor die. In the package after encapsulating, there were no voids or delamination, and no cracks were observed after solder reflow.

In Example 9, the volatile content after spin coating/heating was small, and an appearance and a thickness precision were satisfactory. A tackiness was 0.02 N and 2.5 N at 25° C. and 80° C., respectively, pickup properties were good, and wire bonding could be conducted without curing after mounting a semiconductor die. In the package after encapsulating, there were no voids or delamination, and no cracks were observed after solder reflow.

In Comparative Example 10, the volatile content after spin coating/heating was small, and an appearance and a thickness precision were satisfactory. A tackiness at 25° C. was 0.02 N and pickup properties were good, but since it did not contain compound (B1) (a compound containing a phenolic hydroxy group having a molecular weight of 1000 or less) and contained compound (B2) (a compound containing a phenolic hydroxyl group having a molecular weight of 1500 or more and 5000 or less) alone, a tackiness at 80° C. was 0.1 N and a semiconductor die could not be mounted on a support under the conditions as described in Example 1. After changing the mounting conditions, evaluation was continued, but after encapsulating, detachment in a semiconductor die was observed and cracks were observed in all the packages after solder reflow.

TABLE 2

|  |  |  | Example | | | | | Comparable Example |
| --- | --- | --- | --- | --- | --- | --- | --- | --- |
|  |  |  | 5 | 6 | 7 | 8 | 9 | 10 |
| Liquid resin composition |  |  | I | J | K | L | M | N |
| Viscosity |  | Pa·s | 4 | 12 | 4 | 5 | 5 | 13 |
| GPC area(b/a) |  | — | 0.96 | 0.85 | 0.95 | 0.97 | 0.96 | 0.91 |
| Spin coating conditions | Rotation No. | rpm | 1500 | 2300 | 1800 | 1200 | 1600 | 3000 |
|  | Time | sec | 40 | 40 | 40 | 30 | 40 | 40 |
| Thickness after spin coating |  | μm | 52 | 49 | 48 | 53 | 48 | 52 |
| Drying conditions | Temperature | °C. | 120 | 120 | 120 | 120 | 120 | 120 |
|  | Time | min | 10 | 10 | 10 | 10 | 10 | 10 |
| Thickness after drying |  | μm | 32 | 24 | 28 | 41 | 30 | 29 |
| Volatiles |  | wt % | 0.1 | 0.1 | 0.1 | 0.1 | 0.1 | 0.1 |
| Appearance |  | — | Good | Good | Good | Good | Good | Good |
| Thickness precision |  | μm | ±3 | ±2 | ±2 | ±3 | ±3 | ±2 |
| Tackiness | 25° C. | N | 0.02 | 0.02 | 0.02 | 0.02 | 0.02 | 0.02 |
|  | 80° C. | N | 1.8 | 3.0 | 1.5 | 2.3 | 2.5 | 0.1 |
| GPC area(b'/a') |  | — | 0.86 | 0.75 | 0.84 | 0.87 | 0.78 | 0.81 |
| GPC area(b'/a')/(b/a) |  | — | 0.90 | 0.88 | 0.88 | 0.90 | 0.81 | 0.89 |
| Adhesion force | 25° C. | N | 180 | 200 | 180 | 180 | 180 | 5 |
|  | 130° C. | N | 120 | 130 | 120 | 120 | 120 | 3 |
|  | 175° C. | N | 10 | 7 | 10 | 10 | 10 | 2 |
| Void, initial delamination |  | % | <10 | <10 | <10 | <10 | <10 | 50< |
| Solder reflow |  | No. | 0 | 0 | 0 | 0 | 0 | 4 |

*A value could not be read because an adhesion force was too low.
**Not evaluated due to drift of a chip during molding Example 10

Evaluation was conducted as described in Example 5, except that the above liquid resin composition M was applied as described below.

Using the applicator 6 shown in FIG. 2, the liquid resin composition M was applied to a 6 inch wafer under the conditions of average application amount: 0.45 cc/min, wafer rotation speed: 25 rpm, nozzle moving rate: 0.5 mm/sec, and a distance between the tip of the nozzle 61 and the surface of the 6 inch wafer (gap): 100 μm. A thickness after application was 54 μm and an appearance was good. Then, the product was heated in an oven at 120° C. for 10 min. A thickness of the adhesive layer after drying was 32 μm (thickness precision:

±3 µm). Here, in the adhesive layer, a volatile content was 0.1% by weight; a tackiness at 25° C. and 80° C. was 0.02 N and 2.4 N, respectively; a GPC area (b'/a') was 0.78; a GPC area (b'/a')/(b/a) was 0.81; and an adhesion force was 180 N, 120 N and 10 N at 25° C., 130° C. and 175° C., respectively.

In the semiconductor device thus obtained, defects such as voids and initial delamination were not observed and solder reflow was satisfactory. Furthermore, in comparison with application by spin coating, the amount of the liquid adhesive M discarded was reduced.

The invention claimed is:

1. A liquid resin composition for bonding a semiconductor element on a support, comprising compound (A) having a glycidyl group and a compound (B) having a phenolic hydroxy group,
   wherein the composition exhibits a tackiness of 0.05 N or less at 25° C. and a tackiness of 1.5 N or more at 80° C. after heating said liquid resin composition at 120° C. for 10 min,
   a viscosity of said liquid resin composition is 1 Pa·s or more and 40 Pa·s or less at 25° C., and
   wherein said compound (B) having a phenolic hydroxy group comprises compound (B1) having a molecular weight of 1000 or less and compound (B2) having a molecular weight of 1500 or more and 5000 or less.

2. The liquid resin composition as claimed in claim 1, wherein said compound (B2) is a compound containing hydroxystyrene as a monomer component.

3. The liquid resin composition as claimed in claim 1, wherein said compound (B2) has a dispersion degree of 1.5 or less.

4. The liquid resin composition as claimed in claim 1, wherein a weight ratio as said compound (B1)/said compound (B2) is 0.6 or more and 7 or less.

* * * * *